(12) United States Patent
Lee et al.

(10) Patent No.: US 11,495,604 B2
(45) Date of Patent: Nov. 8, 2022

(54) CHANNEL AND BODY REGION FORMATION FOR SEMICONDUCTOR DEVICES

(71) Applicant: Micron Technology, Inc., Boise, ID (US)

(72) Inventors: Si-Woo Lee, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/943,569

(22) Filed: Jul. 30, 2020

(65) Prior Publication Data

US 2022/0037466 A1    Feb. 3, 2022

(51) Int. Cl.
  *H01L 27/108*    (2006.01)
  *H01L 29/10*    (2006.01)

(52) U.S. Cl.
  CPC .. *H01L 27/10873* (2013.01); *H01L 27/10808* (2013.01); *H01L 29/1033* (2013.01); *H01L 29/1095* (2013.01)

(58) Field of Classification Search
  None
  See application file for complete search history.

(56) References Cited

U.S. PATENT DOCUMENTS

| | | | |
|---|---|---|---|
| 5,012,308 A * | 4/1991 | Hieda | H01L 27/10829 257/301 |
| 10,607,995 B2 | 3/2020 | Roberts et al. | |
| 2012/0119286 A1 * | 5/2012 | Kim | H01L 29/66666 257/329 |
| 2012/0217571 A1 * | 8/2012 | Arai | G11C 16/0466 257/324 |
| 2018/0323200 A1 | 11/2018 | Tang et al. | |
| 2019/0103406 A1 | 4/2019 | Tang et al. | |
| 2019/0164985 A1 | 5/2019 | Lee et al. | |

OTHER PUBLICATIONS

McDaniel et al., U.S. Appl. No. 16/943,108, entitled "Digit Line Formation for Horizontally Oriented Access Devices," filed Jul. 30, 2020. 90 pages. (Year: 2020).*
U.S. Appl. No. 16/204,224, entitled, "Memory Arrays," filed Nov. 29, 2018, 43 pages.

* cited by examiner

*Primary Examiner* — Anthony Ho
*Assistant Examiner* — Kevin Quinto
(74) *Attorney, Agent, or Firm* — Brooks, Cameron & Huebsch, PLLC

(57) ABSTRACT

Systems, methods and apparatus are provided for forming layers of a first dielectric material, a semiconductor material, and a second dielectric material in repeating iterations vertically to form a vertical stack and forming a vertical opening using an etchant process to expose vertical sidewalls in the vertical stack. A seed material that is selective to the semiconductor material is deposited over the vertical stack and the vertical sidewalls in the vertical stack and the seed material is processed such that the seed material advances within the semiconductor material such that it transforms a crystalline structure of a portion of the semiconductor material.

25 Claims, 27 Drawing Sheets

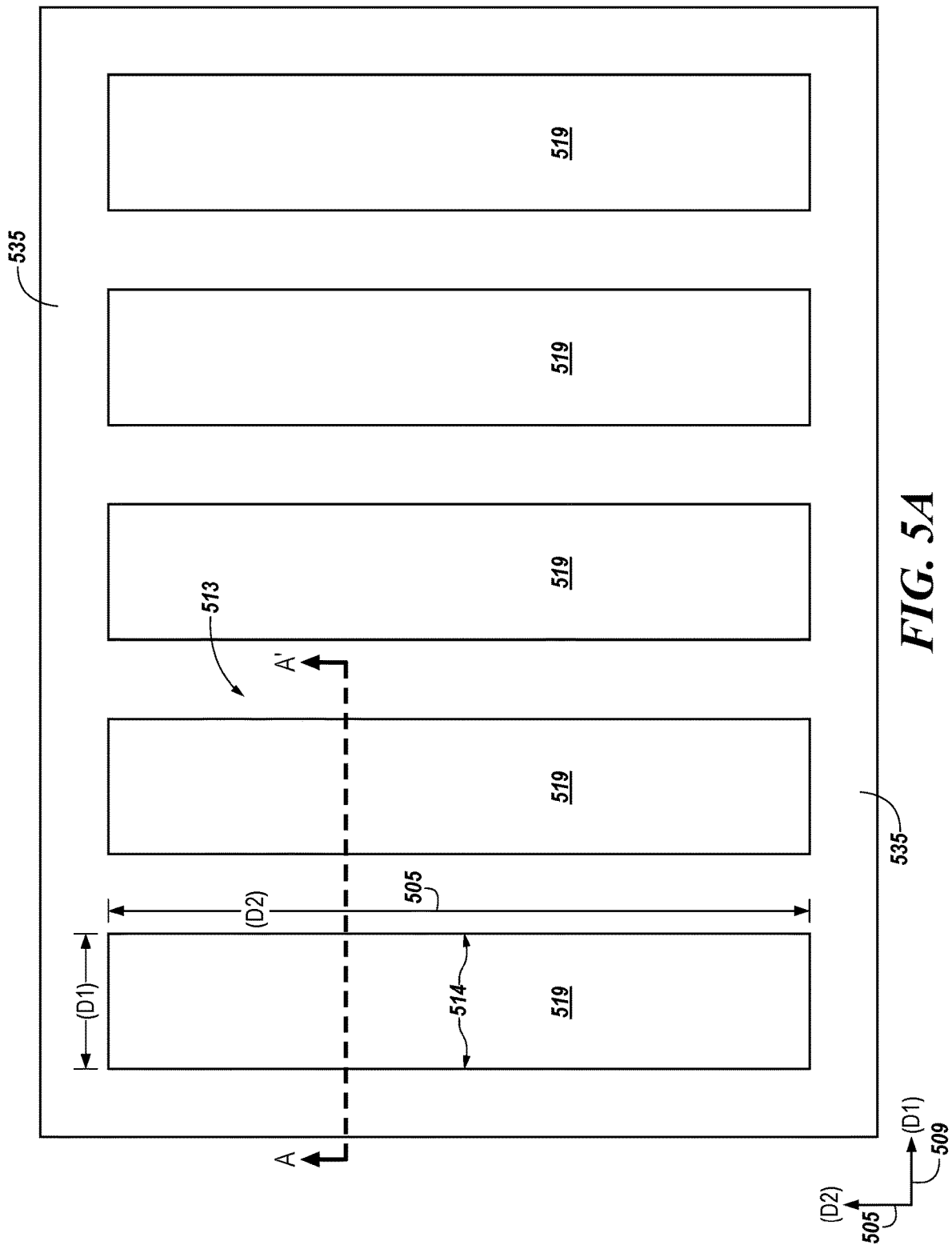

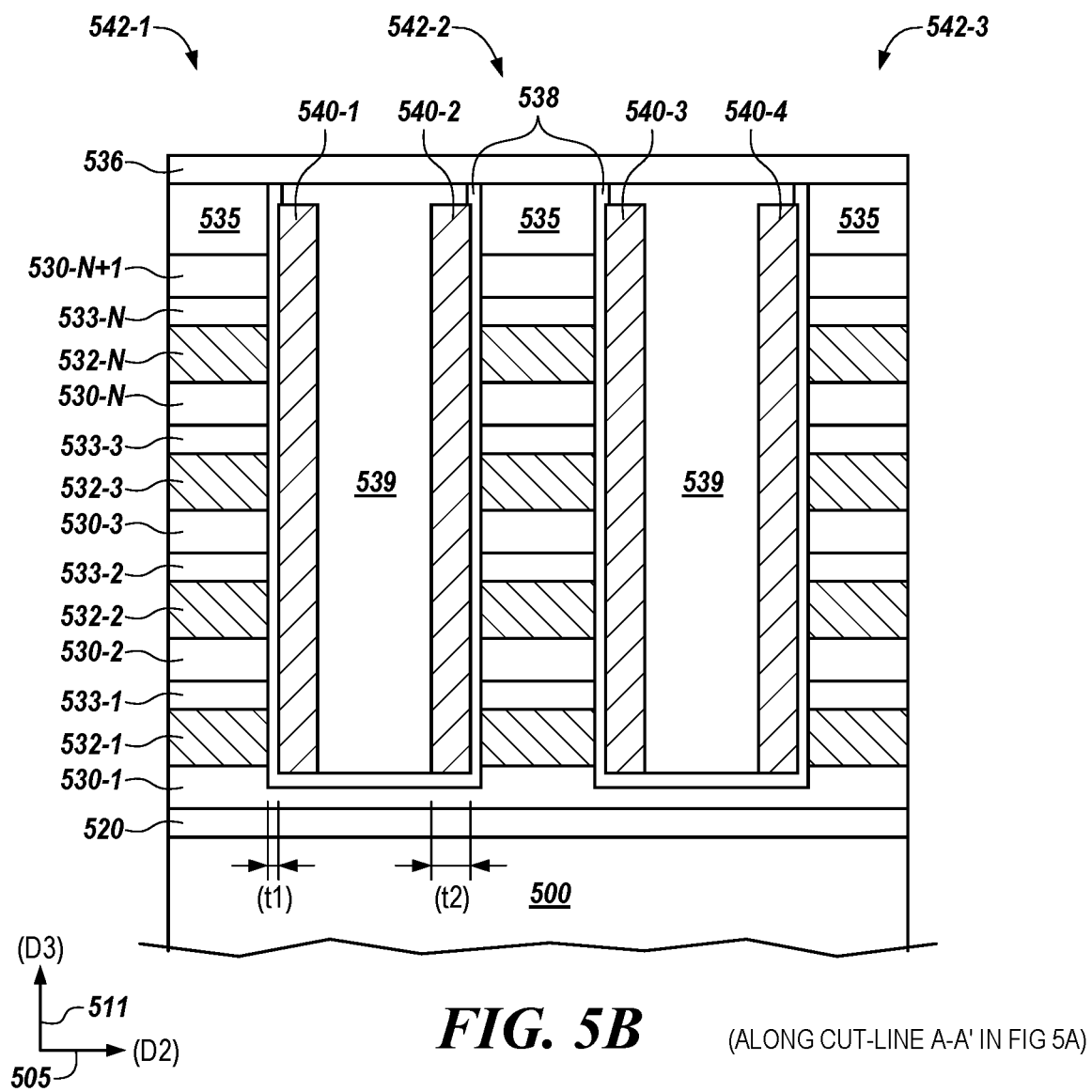
FIG. 5B (ALONG CUT-LINE A-A' IN FIG 5A)

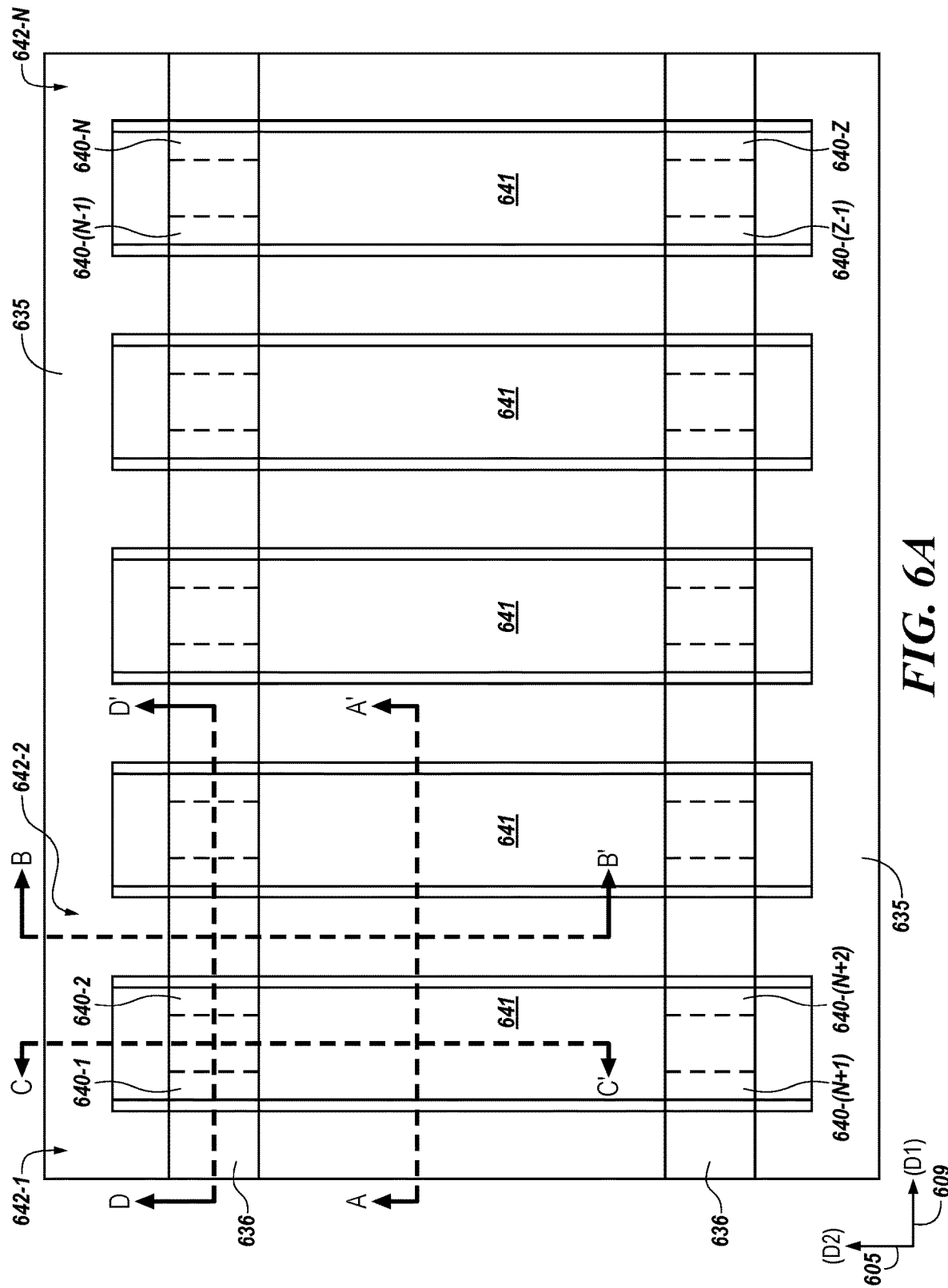

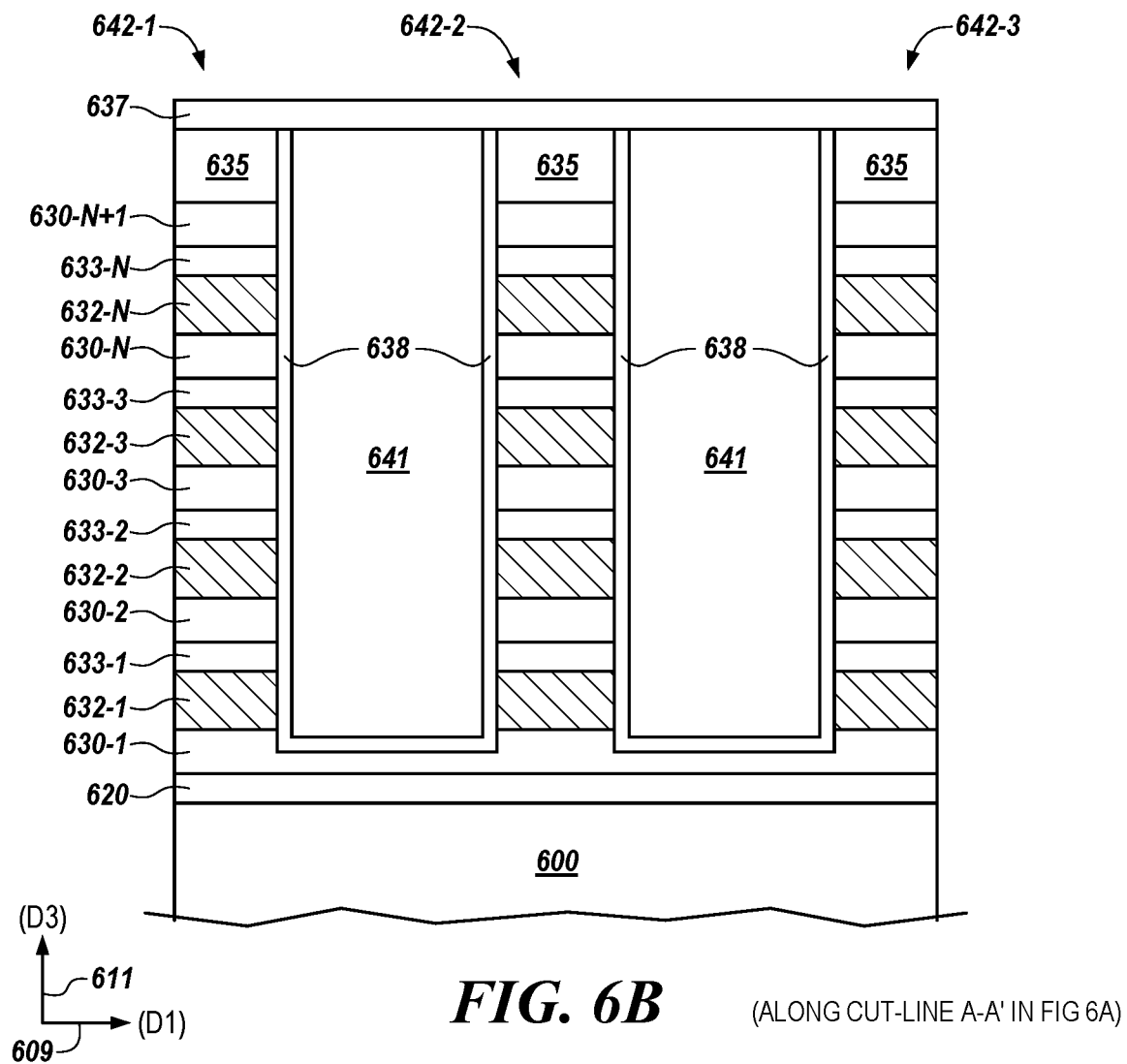
FIG. 6B (ALONG CUT-LINE A-A' IN FIG 6A)

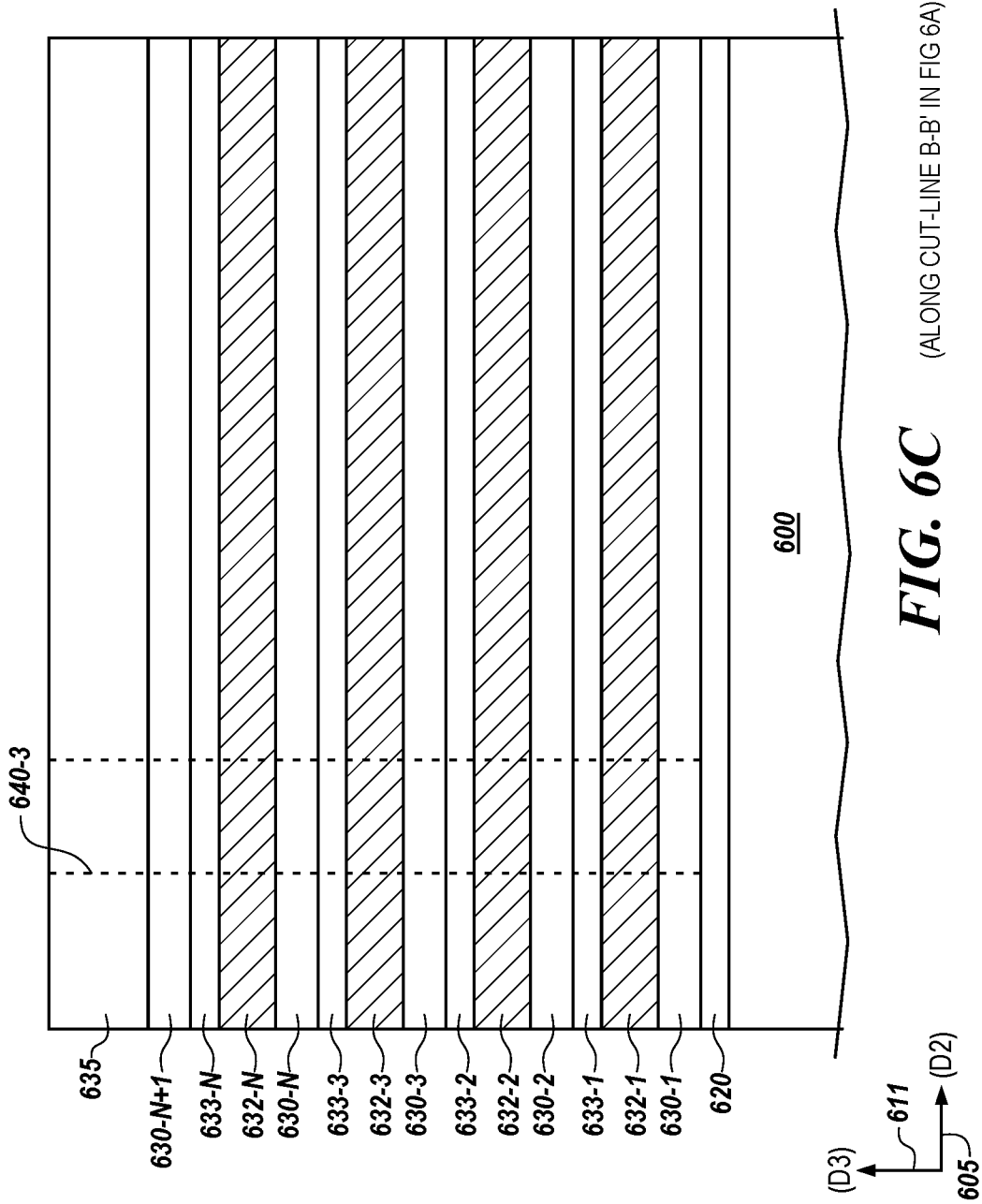
FIG. 6C (ALONG CUT-LINE B-B' IN FIG 6A)

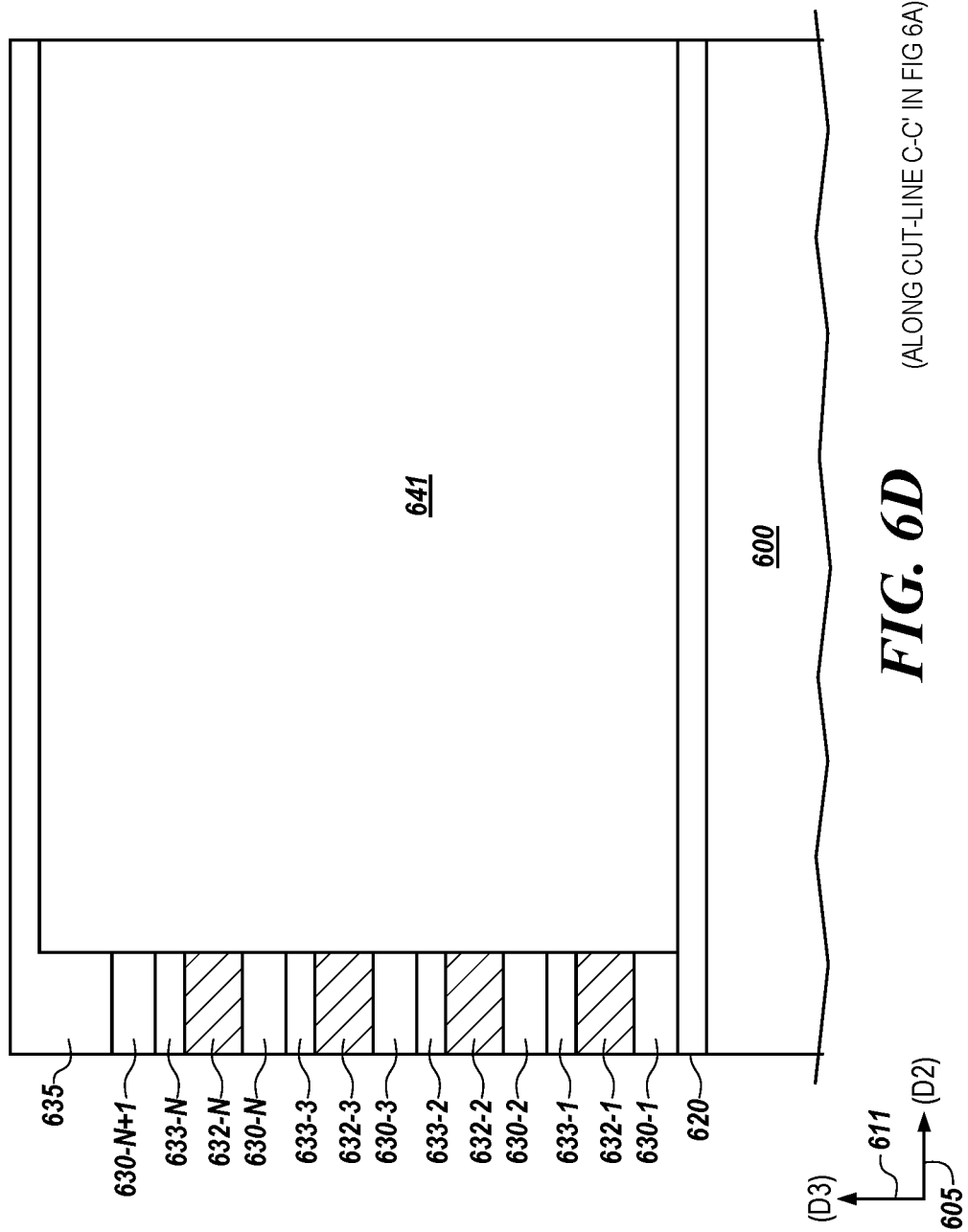
FIG. 6D (ALONG CUT-LINE C-C' IN FIG 6A)

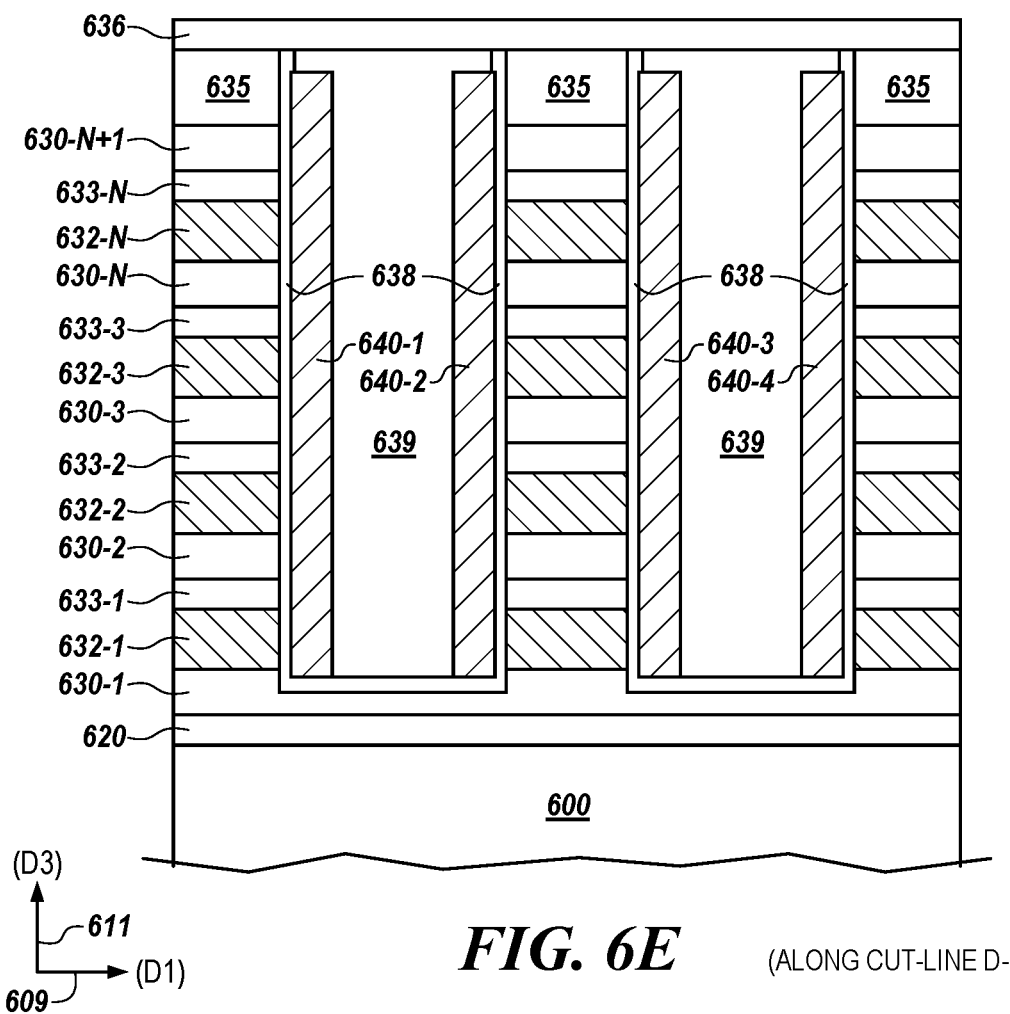
FIG. 6E (ALONG CUT-LINE D-D' IN FIG 6A)

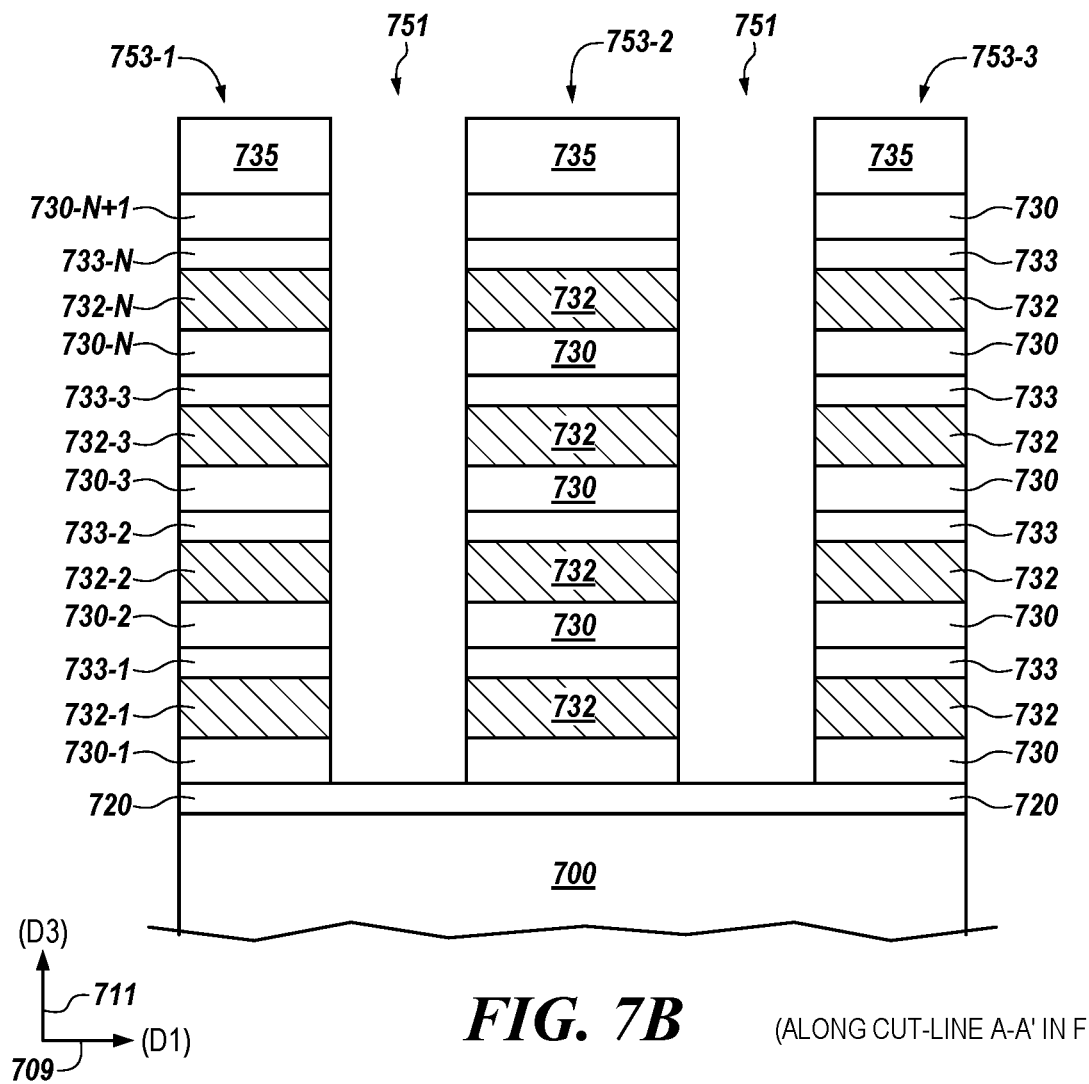
FIG. 7B (ALONG CUT-LINE A-A' IN FIG 7A)

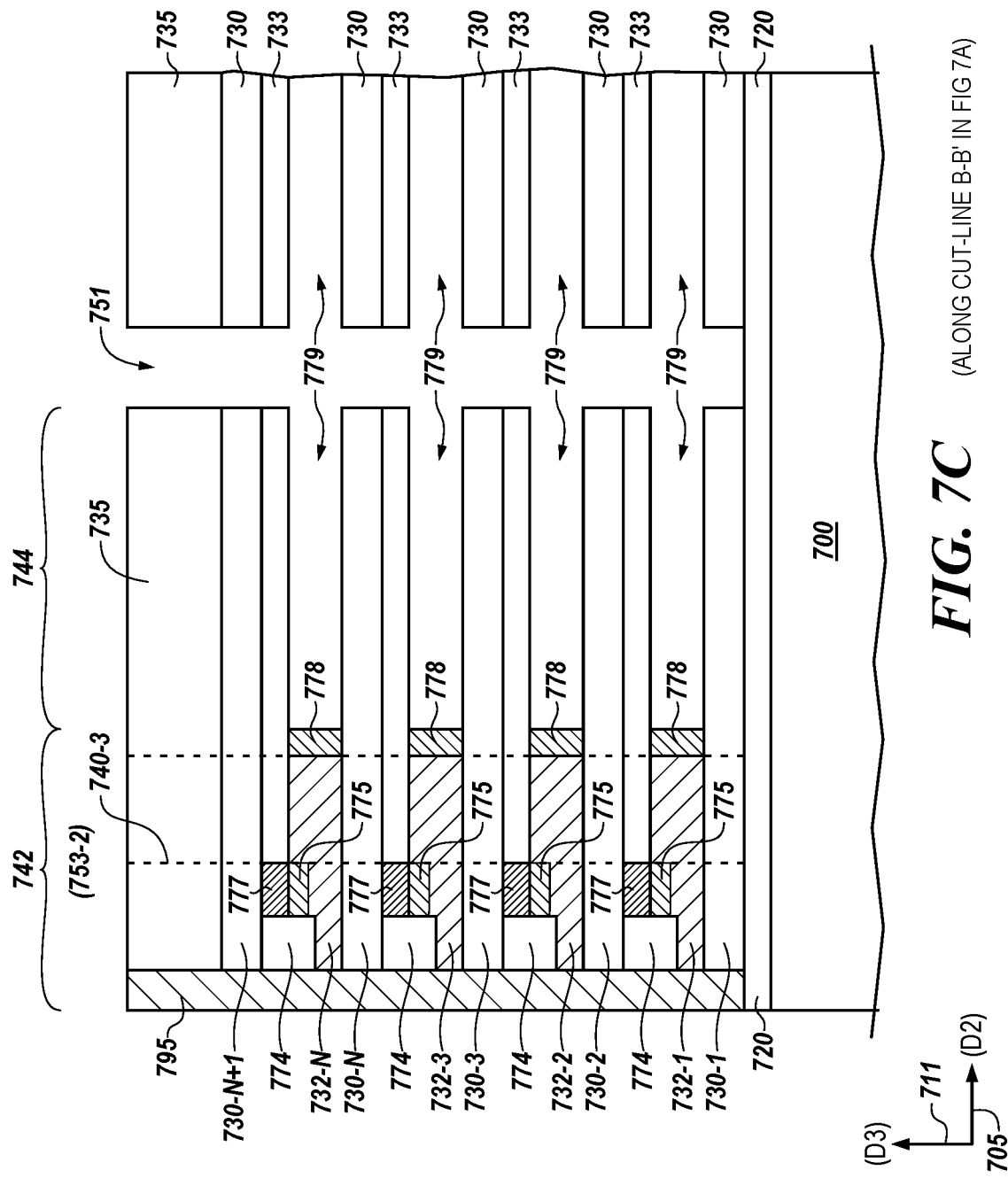
FIG. 7C (ALONG CUT-LINE B-B' IN FIG 7A)

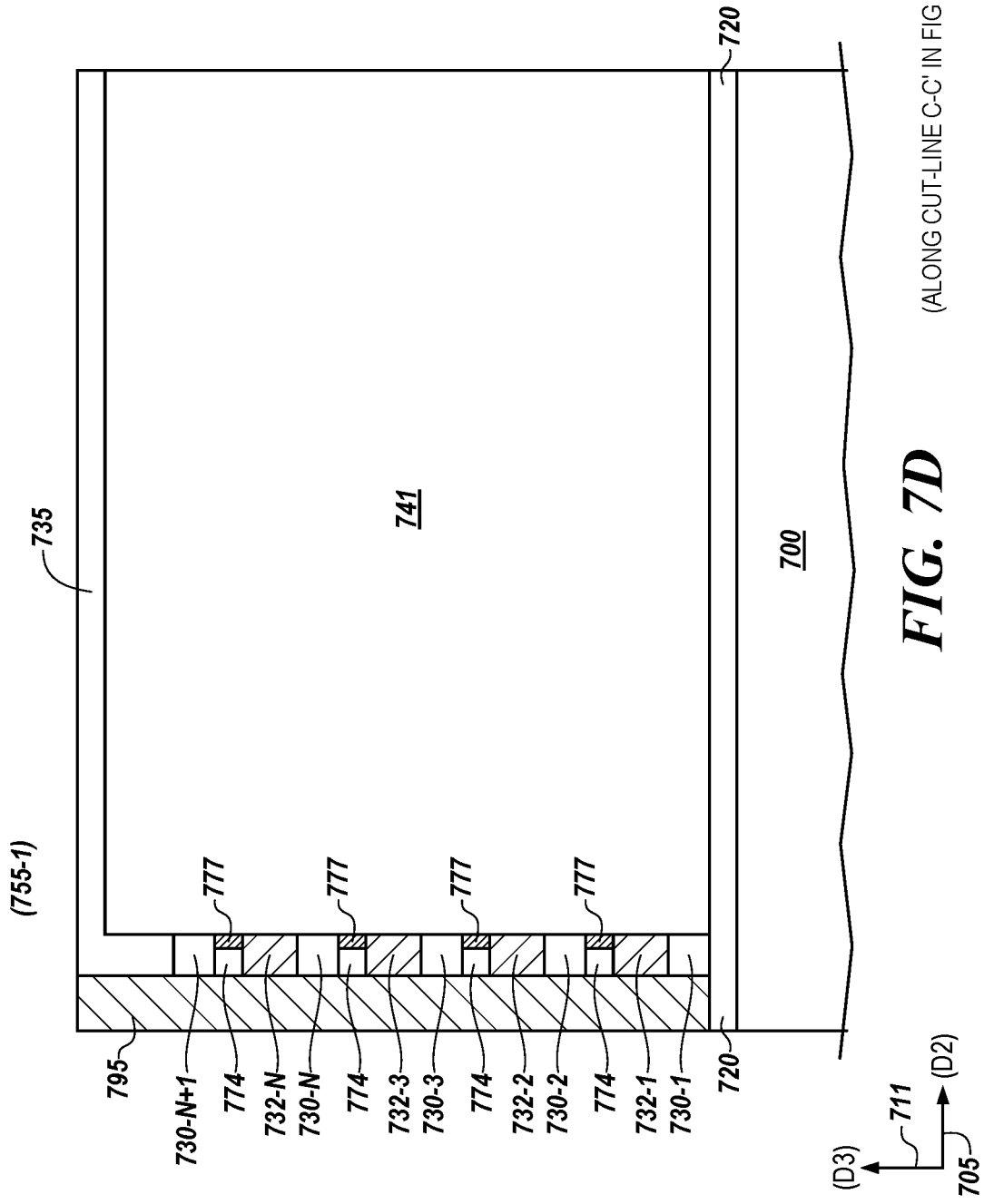
FIG. 7D (ALONG CUT-LINE C-C' IN FIG 7A)

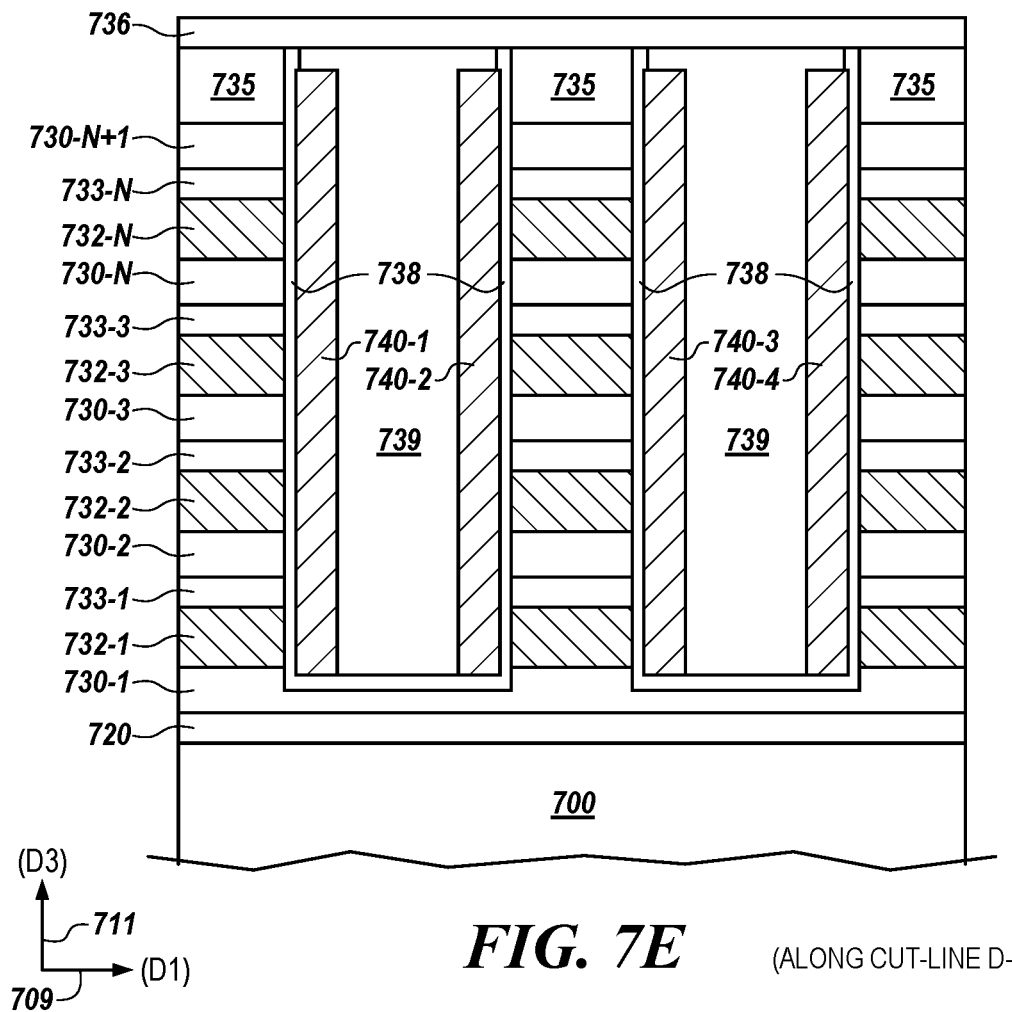
FIG. 7E (ALONG CUT-LINE D-D' IN FIG 7A)

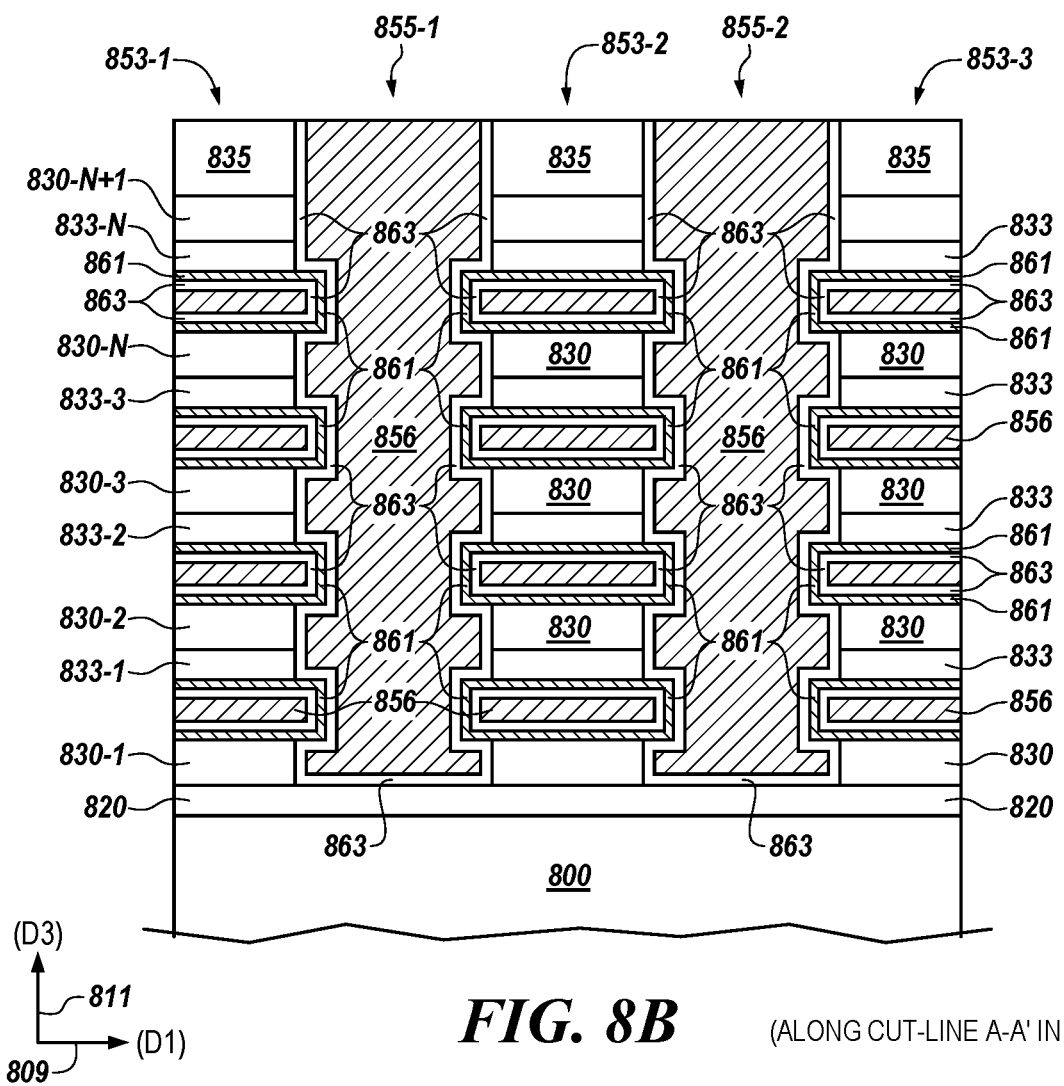
FIG. 8B (ALONG CUT-LINE A-A' IN FIG 8A)

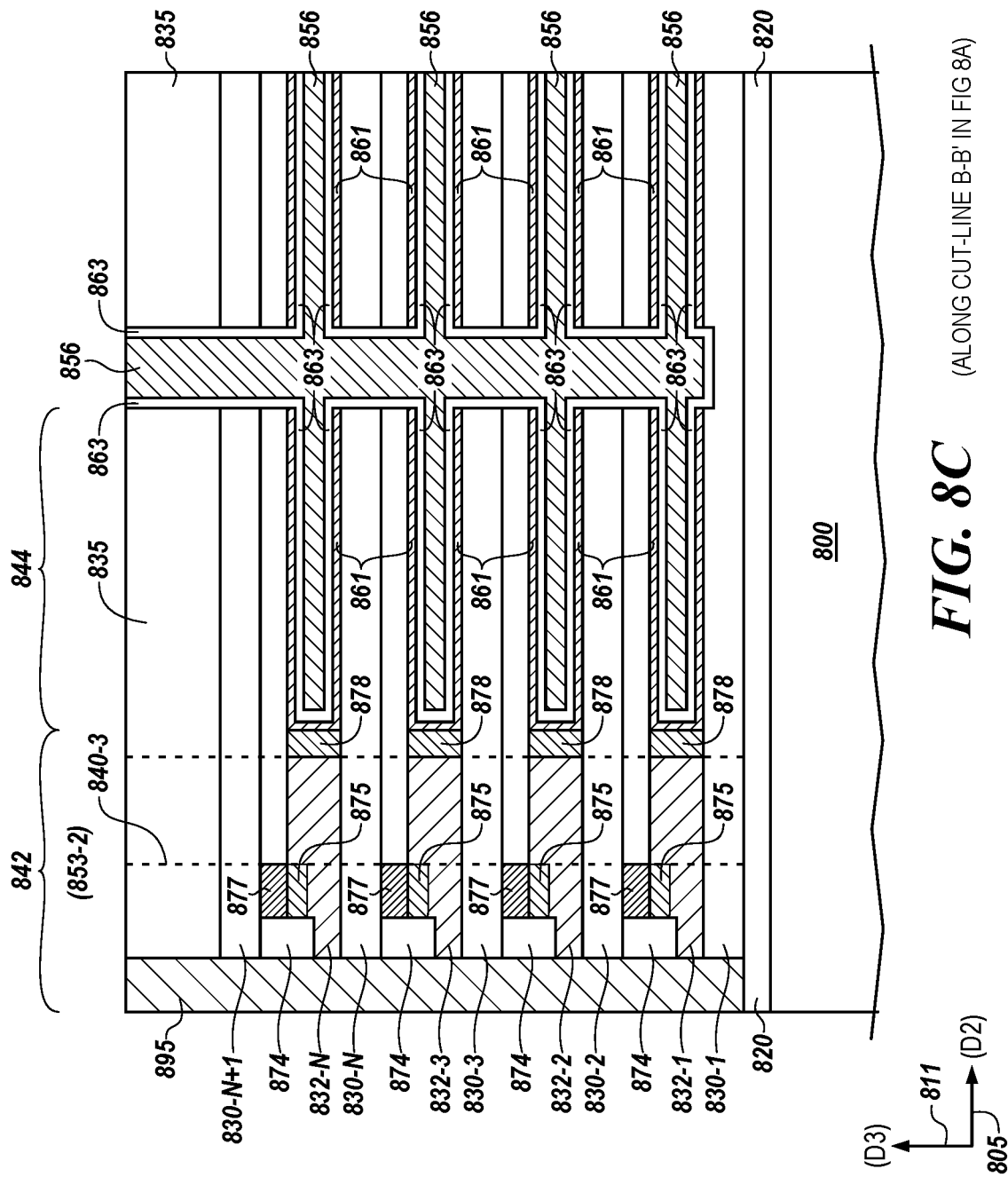
FIG. 8C (ALONG CUT-LINE B-B' IN FIG 8A)

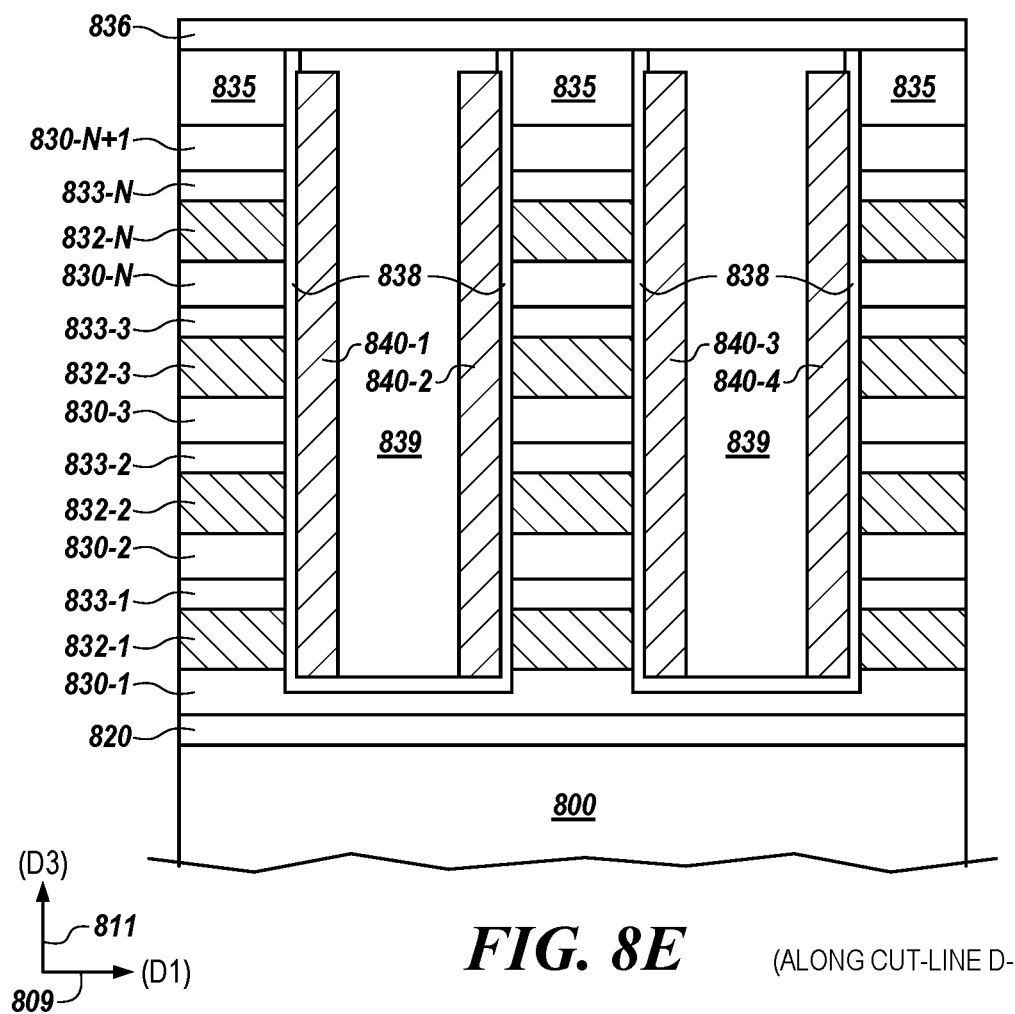
FIG. 8E (ALONG CUT-LINE D-D' IN FIG 8A)

CHANNEL AND BODY REGION FORMATION FOR SEMICONDUCTOR DEVICES

TECHNICAL FIELD

The present disclosure relates generally to memory devices, and more particularly, to channel and body region formation for semiconductor devices.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel and body region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic "1" or "0").

BRIEF DESCRIPTION OF THE DRAWINGS

FIGS. 5A-5B illustrate an example method, at another stage of a semiconductor fabrication process, for forming arrays of vertically stacked memory cells having a channel and body region for semiconductor devices and vertically oriented access lines, in accordance with a number of embodiments of the present disclosure.

FIGS. 6A to 6E illustrate an example method, at another stage of a semiconductor fabrication process, for forming arrays of vertically stacked memory cells having a channel and body region for semiconductor devices, in accordance with a number of embodiments of the present disclosure.

FIGS. 7A to 7E illustrate an example method, at another stage of a semiconductor fabrication process, for forming arrays of vertically stacked memory cells having a channel and body region for semiconductor devices, in accordance with a number of embodiments of the present disclosure.

FIGS. 8A to 8E illustrate an example method, at another stage of a semiconductor fabrication process, for forming arrays of vertically stacked memory cells having a channel and body region for semiconductor devices, in accordance with a number of embodiments of the present disclosure.

DETAILED DESCRIPTION

Figure 1:
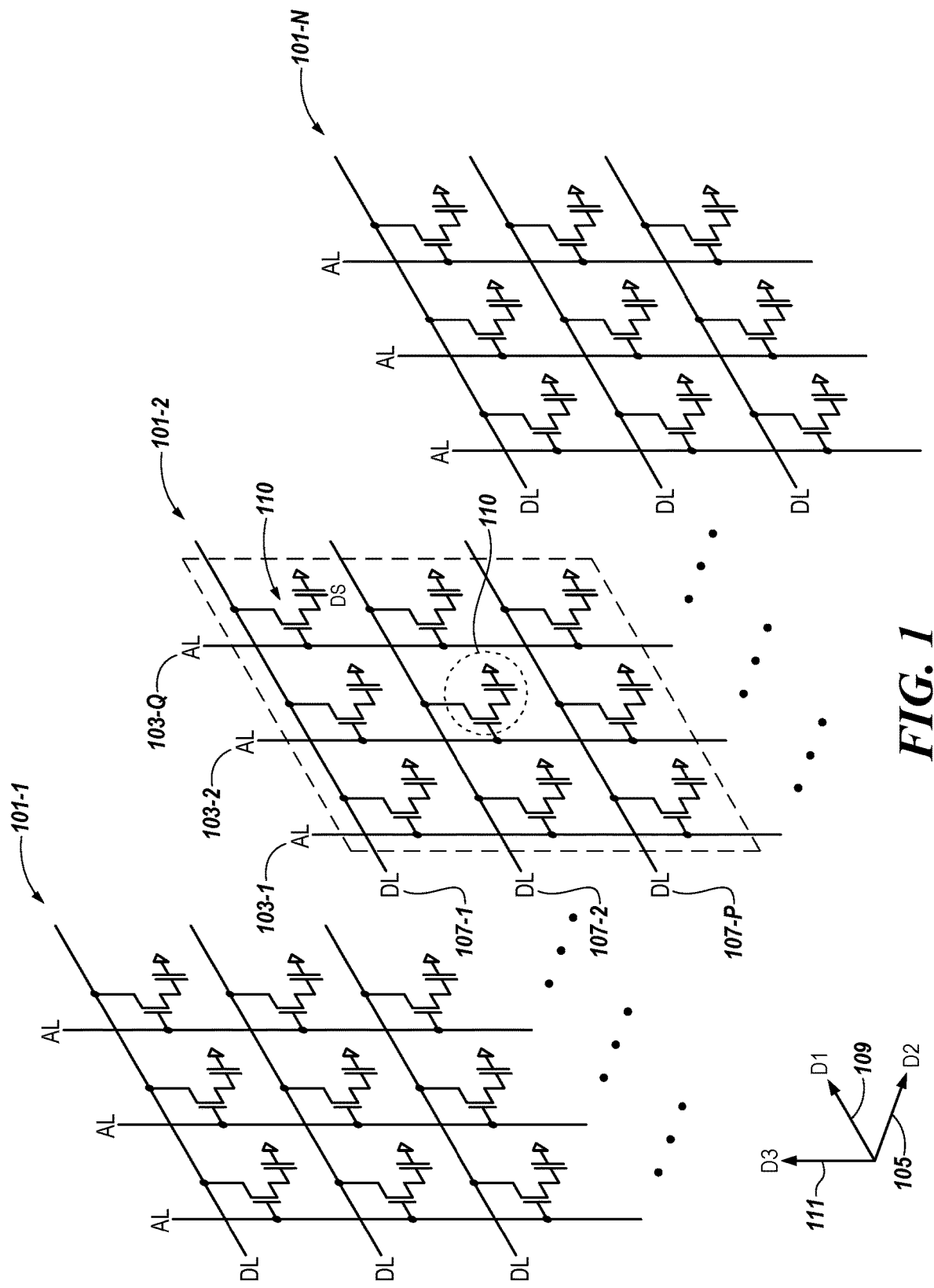
FIG. 1 is a schematic illustration of a vertical three dimensional (3D) memory in accordance a number of embodiments of the present disclosure.

Embodiments of the present disclosure describe channel and body region formation for semiconductor devices. A channel and body region is formed with horizontal access devices in an array of vertically stacked memory cells. The horizontal access devices are integrated with vertically oriented access lines and integrated with horizontally oriented digit lines. The channel may provide improved electron mobility due to the increased grain size of the amorphous silicon material in the channel and a decreased density in the grain boundary. The decreased grain boundary density may also decrease the electron hole pair generation and decrease the value if the off current (Ioff). Further, the metal induced lateral crystallization (MILC) distance may be such that it only covers the channel region. This may decrease the anneal process time in comparison to other processes not disclosed herein.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIG. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

FIG. 1 is a block diagram of an apparatus in accordance a number of embodiments of the present disclosure. FIG. 1 illustrates a circuit diagram showing a cell array of a three dimensional (3D) semiconductor memory device according to embodiments of the present disclosure. FIG. 1 illustrates a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 103-1, 103-2, . . . , 103-Q (which also may be referred to a word lines). Also, each of the sub cell arrays, e.g., sub cell array 101-2, may include a plurality of digit lines 107-1, 107-2, . . . , 107-P (which also may be referred to as bit lines, data lines, or sense lines). In FIG. 1, the digit lines 107-1, 107-2, . . . , 107-P are illustrated extending in a first direction (D1) 109 and the access lines 103-1, 103-2, . . . , 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the access lines 103-1, 103-2, . . . , 103-Q are extending in a vertical direction, e.g., third direction (D3) 111.

A memory cell, e.g., 110, may include an access device, e.g., access transistor, and a storage node, e.g., storage capacitor, located at an intersection of each access line 103-1, 103-2, . . . , 103-Q and each digit line 107-1, 107-2, . . . , 107-P. Memory cells may be written to, or read from, using the access lines 103-1, 103-2, . . . , 103-Q and digit lines 107-1, 107-2, . . . , 107-P. The digit lines 107-1, 107-2, . . . , 107-P may conductively interconnect memory cells along horizontal columns of each sub cell array 101-, 101-2, . . . , 101-N, and the access lines 103-1, 103-2, . . . , 103-Q may conductively interconnect memory cells along vertical rows of each sub cell array 101-1, 101-2, . . . , 101-N. One memory cell, e.g. 110, may be located between one access line, e.g., 103-2, and one digit line, e.g., 107-2. Each memory cell may be uniquely addressed through a combination of an access line 103-1, 103-2, . . . , 103-Q and a digit line 107-1, 107-2, . . . , 107-P.

The digit lines 107-1, 107-2, . . . , 107-P may be or include conducting patterns (e.g., metal lines) disposed on and spaced apart from a substrate. The digit lines 107-1, 107-2, . . . , 107-P may extend in a first direction (D1) 109. The digit lines 107-1, 107-2, . . . , 107-P in one sub cell array, e.g., 101-2, may be spaced apart from each other in a vertical direction, e.g., in a third direction (D3) 111.

The access lines 103-1, 103-2, . . . , 103-Q may be or include conductive patterns (e.g., metal lines) extending in a vertical direction with respect to the substrate, e.g., in a third direction (D3) 111. The access lines in one sub cell array, e.g., 101-2, may be spaced apart from each other in the first direction (D1) 109.

A gate of a memory cell, e.g., memory cell 110, may be connected to an access line, e.g., 103-2, and a first conductive node, e.g., first source/drain region, of an access device, e.g., transistor, of the memory cell 110 may be connected to a digit line, e.g., 107-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

Figure 2:
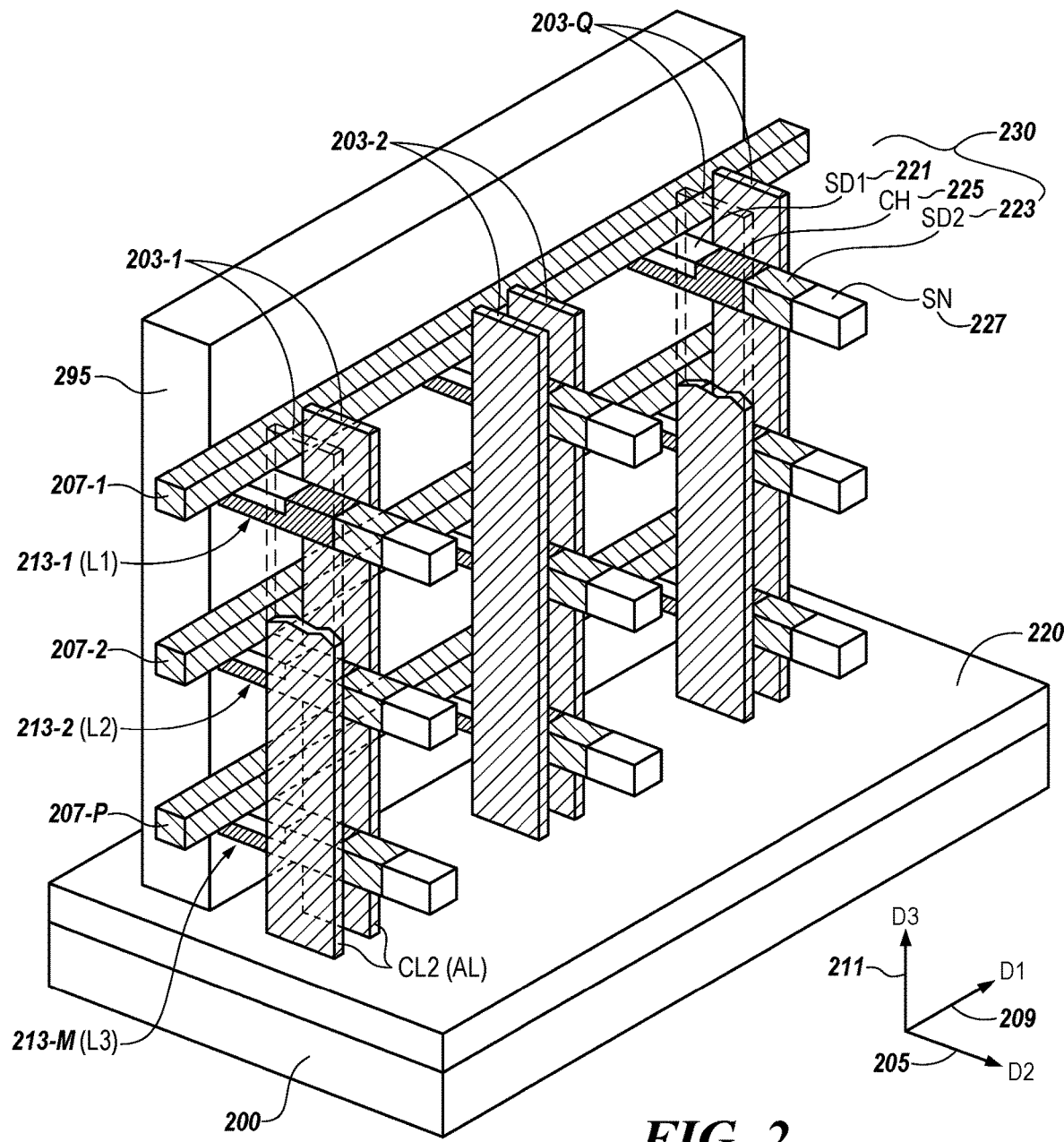
FIG. 2 is a perspective view illustrating a channel and body region of a three-node access device for semiconductor devices in accordance with a number of embodiments of the present disclosure.
Figure 3:
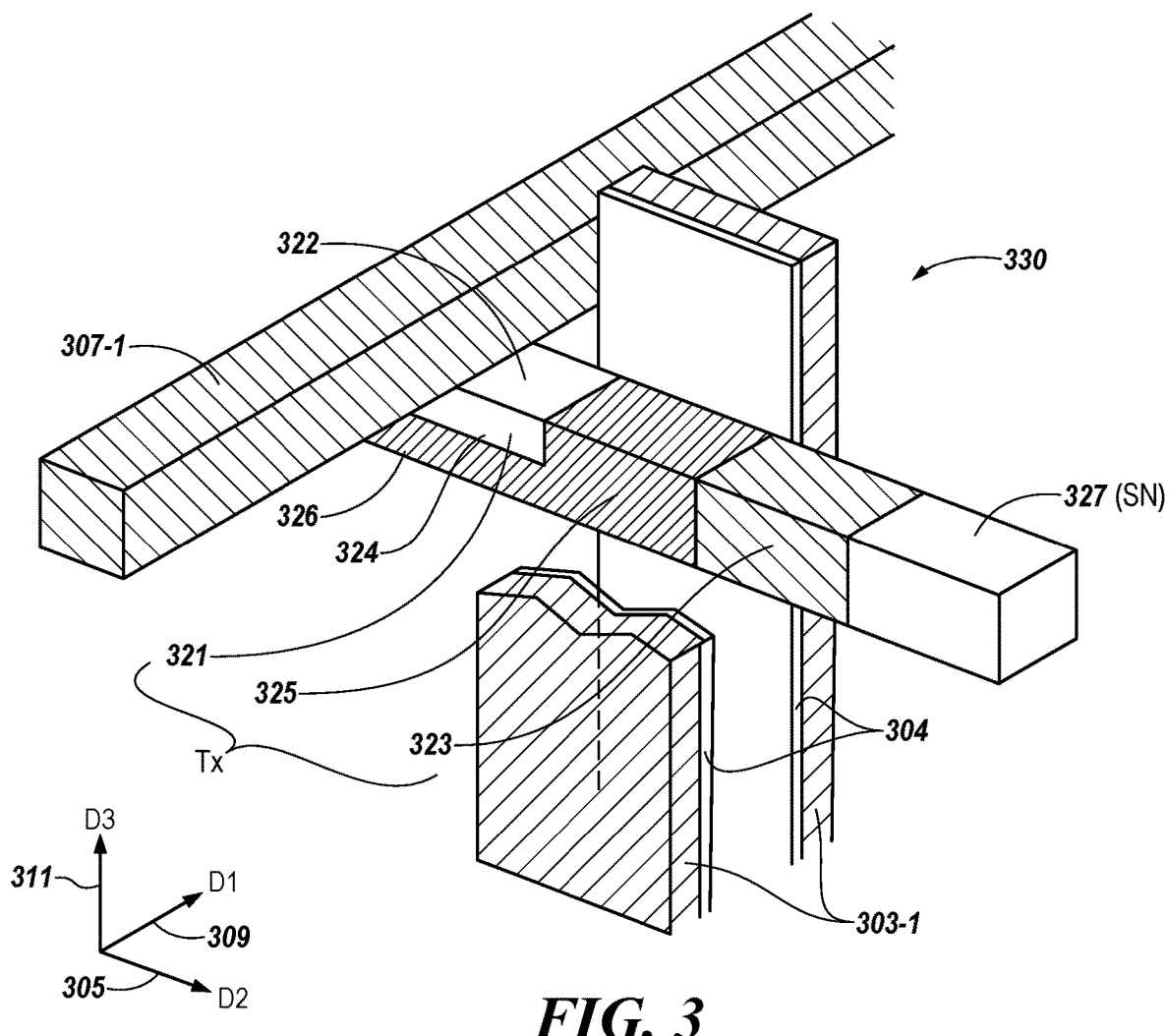
FIG. 3 is a perspective view illustrating a channel and body region of a three-node access device for semiconductor devices in accordance with a number of embodiments of the present disclosure.

FIG. 2 illustrates a perspective view showing a three dimensional (3D) semiconductor memory device, e.g., a portion of a sub cell array 101-2 shown in FIG. 1 as a vertically oriented stack of memory cells in an array, according to some embodiments of the present disclosure. FIG. 3 illustrates a perspective view showing unit cell, e.g., memory cell 110 shown in FIG. 1, of the 3D semiconductor memory device shown in FIG. 2.

As shown in FIG. 2, a substrate 200 may have formed thereon one of the plurality of sub cell arrays, e.g., 101-2, described in connection with FIG. 1. For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells, e.g., memory cell 110 in FIG. 1, extending in a vertical direction, e.g., third direction (D3) 111. According to some embodiments the vertically oriented stack of memory cells may be fabricated such that each memory cell, e.g., memory cell 110 in FIG. 1, is formed on plurality of vertical levels, e.g., a first level (L1), a second level (L2), and a third level (L3). The repeating, vertical levels, L1, L2, and L3, may be arranged, e.g., "stacked", a vertical direction, e.g., third direction (D3) 111 shown in FIG. 1, and separated from the substrate 200 by an insulator material 220. Each of the repeating, vertical levels, L1, L2, and L3 may include a plurality of discrete components, e.g., regions, to the laterally oriented access devices 230, e.g., transistors, and storage nodes, e.g., capacitors, including access line 203-1, 203-2, . . . , 203-Q connections and digit line 207-1, 207-2, . . . , 207-P connections. The plurality of discrete components to the laterally oriented access devices 230, e.g., transistors, may be formed in a plurality of iterations of vertically, repeating layers within each level, as described in more detail below in connection with FIGS. 4A-4F and may extend horizontally in the second direction (D2) 205, analogous to second direction (D2) 105 shown in FIG. 1.

The plurality of discrete components to the laterally oriented access devices 230, e.g., transistors, may include a first source/drain region 221 and a second source/drain region 223 separated by a channel and body region 225, extending laterally in the second direction (D2) 205, and formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include Phosphorous (P) atoms and the p-type dopant may include atoms of Boron (B) formed in an oppositely doped body region of polysilicon semiconductor material. Embodiments, however, are not limited to these examples.

The storage node 227, e.g., capacitor, may be connected to one respective end of the access device. As shown in FIG. 2, the storage node 227, e.g., capacitor may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1, may similarly extend in the second direction (D2) 205, analogous to second direction (D2) 105 shown in FIG. 1.

As shown in FIG. 2 a plurality of horizontally oriented digit lines 207-1, 207-2, . . . , 207-P extend in the first direction (D1) 209, analogous to the first direction (D1) 109 in FIG. 1. The plurality of horizontally oriented digit lines 207-1, 207-2, . . . , 207-P may be analogous to the digit lines 107-1, 107-2, . . . , 107-P shown in FIG. 1. The plurality of horizontally oriented digit lines 207-1, 207-2, . . . , 207-P may be arranged, e.g., "stacked", along the third direction (D3) 211. The plurality of horizontally oriented digit lines 207-1, 207-2, . . . , 207-P may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), etc., and/or a metal-semiconductor compound, e.g., tungsten silicide, cobalt silicide, silver silicide, titanium silicide, etc. Embodiments, however, are not limited to these examples.

Among each of the vertical levels, (L1) 213-1, (L2) 213-2, and (L3) 213-M, the horizontally oriented memory cells, e.g., memory cell 110 in FIG. 1, may be spaced apart from one another horizontally in the first direction (D1) 209. However, as described in more detail below in connection with FIGS. 4A-4E, the plurality of discrete components to the laterally oriented access devices 230, e.g., first source/drain region 221 and second source/drain region 223 separated by a channel and body region 225, extending laterally in the second direction (D2) 205, and the plurality of horizontally oriented digit lines 207-1, 207-2, . . . , 207-P extending laterally in the first direction (D1) 209, may be formed within different vertical layers within each level. For example, the plurality of horizontally oriented digit lines 207-1, 207-2, . . . , 207-P, extending in the first direction (D1) 209, may be disposed on, and in electrical contact with, top surfaces of first source/drain regions 221 and orthogonal to laterally oriented access devices 230, e.g., transistors, extending in laterally in the second direction (D2) 205. In some embodiments, the plurality of horizontally oriented digit lines 207-1, 207-2, . . . , 207-P, extending in the first direction (D1) 209 are formed in a higher vertical layer, farther from the substrate 200, within a level, e.g., within level (L1), than a layer in which the discrete components, e.g., first source/drain region 221 and second source/drain region 223 separated by a channel and body region 225, of the laterally oriented access device are formed. In some embodiments, the plurality of horizontally oriented digit lines 207-1, 207-2, . . . , 207-P, extending in the first direction (D1) 209, may be connected to the top surfaces of the first source/drain regions 221 directly and/or through additional contacts including metal silicides.

As shown in the example embodiment of FIG. 2, the access lines, 203-1, 203-2, . . . , 203-Q, extend in a vertical direction with respect to the substrate 200, e.g., in a third direction (D3) 211. Further, as shown in FIG. 2, the access lines, 203-1, 203-2, . . . , 203-Q, in one sub cell array, e.g., sub cell array 101-2 in FIG. 1, may be spaced apart from each other in the first direction (D1) 209. The access lines, 203-1, 203-2, . . . , 203-Q, may be provided, extending vertically relative to the substrate 200 in the third direction (D3) 211 between a pair of the laterally oriented access devices 230, e.g., transistors, extending laterally in the second direction (D2) 205, but adjacent to each other on a level, e.g., first level (L1), in the first direction (D1) 209. Each of the access lines, 203-1, 203-2, . . . , 203-Q, may vertically extend, in the third direction (D3), on sidewalls of respective ones of the plurality of laterally oriented access devices 230, e.g., transistors, that are vertically stacked.

For example, and as shown in more detail in FIG. 3, a first one of the vertically extending access lines, e.g., 203-1, may be adjacent a sidewall of a channel and body region 225 to a first one of the laterally oriented access devices 230, e.g., transistors, in the first level (L1) 213-1, a sidewall of a channel and body region 225 of a first one of the laterally oriented access devices 230, e.g., transistors, in the second level (L2) 213-2, and a sidewall of a channel and body region 225 of a first one of the laterally oriented access devices 230, e.g., transistors, in the third level (L3) 213-M, etc. Similarly, a second one of the vertically extending access lines, e.g., 203-2, may be adjacent a sidewall to a channel and body region 225 of a second one of the laterally oriented access devices 230, e.g., transistors, in the first level (L1) 213-1, spaced apart from the first one of laterally oriented access devices 230, e.g., transistors, in the first level (L1) 213-1 in the first direction (D1) 209. And the second one of the vertically extending access lines, e.g., 203-2, may be adjacent a sidewall of a channel and body region 225 of a second one of the laterally oriented access devices 230, e.g., transistors, in the second level (L2) 213-2, and a sidewall of a channel and body region 225 of a second one of the laterally oriented access devices 230, e.g., transistors, in the third level (L3) 213-M, etc. Embodiments are not limited to a particular number of levels.

The vertically extending access lines, 203-1, 203-2, . . . , 203-Q, may include a conductive material, such as, for example, one of a doped semiconductor material, a conductive metal nitride, metal, and/or a metal-semiconductor compound. The access lines, 203-1, 203-2, . . . , 203-Q, may correspond to word lines (WL) described in connection with FIG. 1.

As shown in the example embodiment of FIG. 2, a conductive body contact 250 may be formed extending in the first direction (D1) 209 along an end surface of the laterally oriented access devices 230, e.g., transistors, in each level (L1) 213-1, (L2) 213-2, and (L3) 213-M above the substrate 200. The body contact 250 may be connected to a body 226, e.g., body region, of the laterally oriented access devices 230, e.g., transistors, in each memory cell, e.g., memory cell 110 in FIG. 1. The body contact 250 may include a conductive material such as, for example, one of a doped semiconductor material, a conductive metal nitride, metal, and/or a metal-semiconductor compound.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 3, the first and the second source/drain regions, 321 and 323, may be impurity doped regions to the laterally oriented access devices 330, e.g., transistors. The first and the second source/drain regions, 321 and 323, may be analogous to the first and the second source/drain regions 221 and 223 shown in FIG. 2. The first and the second source/drain regions may be separated by a channel and body region 325 formed in a body of semiconductor material, e.g., body region 326, of the laterally oriented access devices 230, e.g., transistors. The first and the second source/drain regions, 321 and 323, may be formed from an n-type or p-type dopant doped in the body region 326. Embodiments are not so limited.

For example, for an n-type conductivity transistor construction the body region 326 of the laterally oriented access devices 230, e.g., transistors, may be formed of a low doped (p−) p-type semiconductor material. In one embodiment, the body region 326 and the channel 325 separating the first and the second source/drain regions, 321 and 323, may include a low doped, p-type (e.g., low dopant concentration (p−)) polysilicon material consisting of Boron (B) atoms as an impurity dopant to the polycrystalline silicon. In this example, the first and the second source/drain regions, 321 and 321, may include a high dopant concentration, n-type conductivity impurity (e.g., high dopant (n+)) doped in the first and the second source/drain regions, 321 and 323. In some embodiments, the high dopant, n-type conductivity first and second drain regions 321 and 323 may include a high concentration of Phosphorus (P) atoms deposited therein. Embodiments, however, are not limited to this example. In other embodiments, the laterally oriented access devices 230, e.g., transistors, may be of a p-type conductivity construction in which case the impurity, e.g., dopant, conductivity types would be reversed.

As shown in the example embodiment of FIG. 3, the first source/drain region 321 may occupy an upper portion in the body 326 of the laterally oriented access devices 330, e.g., transistors. For example, the first source/drain region 321 may have a bottom surface 324 within the body 326 of the laterally oriented access device 330 which is located higher, vertically in the third direction (D3) 311, than a bottom surface of the body 326 of the laterally, horizontally oriented access device 330. As such, the laterally, horizontally oriented transistor 330 may have a body portion 326 which is below the first source/drain region 321 and is in electrical contact with the body contact, e.g., 250 shown in FIG. 2. Further, as shown in the example embodiment of FIG. 3, a digit line, e.g., 307-1, analogous to the digit lines 207-1, 207-2, . . . , 207-P in FIG. 2 and 107-1, 107-2, . . . , 107-P shown in FIG. 1, may disposed on a top surface 322 of the first source/drain region 321 and electrically coupled thereto.

As shown in the example embodiment of FIG. 3, an access line, e.g., 303-1, analogous to the access lines 203-1, 203-2, . . . , 203-Q in FIG. 2 and 103-1, 103-2, . . . , 103-Q in FIG. 1, may be vertically extending in the third direction (D3) 311 adjacent sidewall of the channel region 325 portion of the body 326 to the laterally oriented access devices 330, e.g., transistors horizontally conducting between the first and the second source/drain regions 321 and 323 along the second direction (D2) 305. A gate dielectric material 304 may be interposed between the access line 303-1 (a portion thereof forming a gate to the laterally oriented access devices 330, e.g., transistors) and the channel region 325. The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

FIGS. 4A-4F are cross-sectional views for forming arrays of vertically stacked memory cells, at multiple stages of a semiconductor fabrication process, to form a channel and body region for semiconductor devices, in accordance with a number of embodiments of the present disclosure.

Figure 4A:
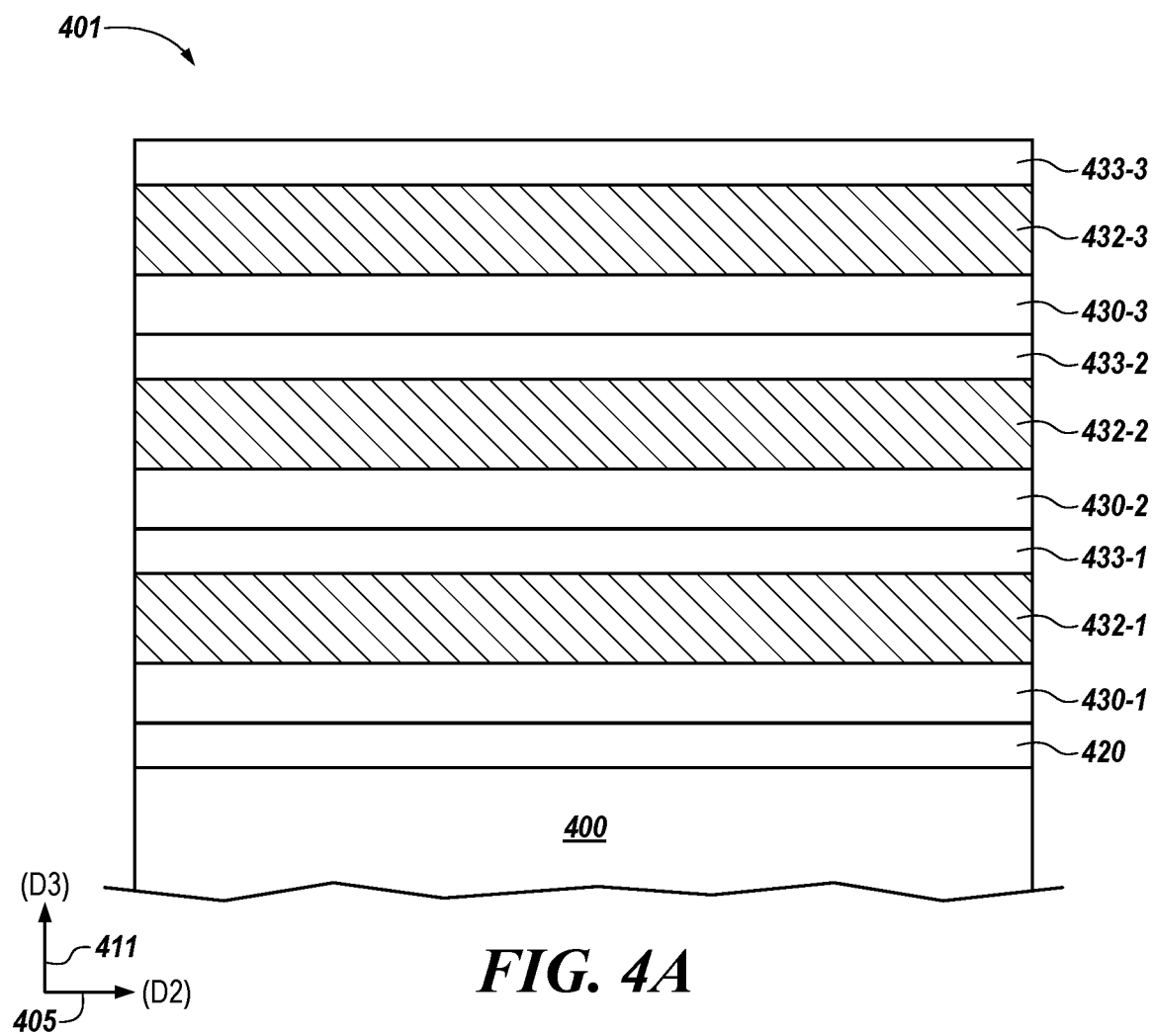
FIGS. 4A-4F are cross-sectional views for forming arrays of vertically stacked memory cells, at multiple stages of a semiconductor fabrication process, to form a channel and body region for semiconductor devices, in accordance with a number of embodiments of the present disclosure.

FIG. 4A is a cross-sectional view, at one stage of the semiconductor fabrication process, for forming arrays of vertically stacked memory cells, to form a channel and body region of a horizontally oriented access device, e.g., transistor, in accordance with a number of embodiments of the present disclosure.

In the example embodiment shown in FIG. 4A, the method comprises depositing alternating layers of a first dielectric material, 430-1, 430-2, . . . , 430-N (collectively referred to as first dielectric material 430), a semiconductor material, 432-1, 432-2, . . . , 432-N (collectively referred to as semiconductor material 432), and a second dielectric material, 433-1, 433-2, . . . , 433-N (collectively referred to as second dielectric 433), in repeating iterations to form a vertical stack 401 on a working surface of a semiconductor substrate 400. In some embodiments, the first dielectric material 430, the semiconductor material 432, and the second dielectric material 433 may be deposited using a chemical vapor deposition (CVD) process. In one embodiment, the first dielectric material 430 can be deposited to have a thickness, e.g., vertical height in the third direction (D3), in a range of twenty (20) nanometers (nm) to sixty (60) nm. In one embodiment, the semiconductor material 432 can be deposited to have a thickness, e.g., vertical height, in a range of twenty (20) nm to one hundred (100) nm. In one embodiment, the second dielectric material 433 can be deposited to have a thickness, e.g., vertical height, in a range of ten (10) nm to thirty (30) nm. Embodiments, however, are not limited to these examples. As shown in FIGS. 4A-4F, a vertical direction 411 is illustrated as a third direction (D3), e.g., z-direction in an x-y-z coordinate system, analogous to the third direction (D3) among first, second, and third directions, shown in FIGS. 1-3.

In some embodiments, the first dielectric material, 430-1, 430-2, . . . , 430-N, may be an interlayer dielectric (ILD). By way of example, and not by way of limitation, the first dielectric material, 430-1, 430-2, . . . , 430-N, may comprise an oxide material, e.g., $SiO_2$. In another example the first dielectric material, 430-1, 430-2, . . . , 430-N, may comprise a silicon nitride ($Si_3N_4$) material (also referred to herein as "SiN"). In another example the first dielectric material, 430-1, 430-2, . . . , 430-N, may comprise a silicon oxy-carbide ($SiO_xC_y$) material. In another example the first dielectric material, 430-1, 430-2, . . . , 430-N, may include silicon oxy-nitride ($SiO_xN_y$) material (also referred to herein as "SiON"), and/or combinations thereof. Embodiments are not limited to these examples.

In some embodiments the semiconductor material, 432-1, 432-2, . . . , 432-N, may comprise a silicon (Si) material in a polycrystalline and/or amorphous state. The semiconductor material, 432-1, 432-2, . . . , 432-N, may be a low doped, p-type (p−) silicon material. The semiconductor material, 432-1, 432-2, . . . , 432-N, may be formed by gas phase doping boron atoms (B), as an impurity dopant, at a low concentration to form the low doped, p-type (p−) silicon material. In some embodiments, the semiconductor material 432-1, 432-2, . . . , 432-N may be formed by gas phase doping boron atoms (B) in-situ. The low doped, p-type (p−) silicon material may be an amorphous silicon material. Embodiments, however, are not limited to these examples.

In some embodiments, the second dielectric material, 433-1, 433-2, . . . , 433-N, may be an interlayer dielectric (ILD). By way of example, and not by way of limitation, the second dielectric material, 433-1, 433-2, . . . , 433-N, may comprise a nitride material. The nitride material may be a silicon nitride ($Si_3N_4$) material (also referred to herein as "SiN"). In another example the second dielectric material, 433-1, 433-2, ..., 433-N, may comprise a silicon oxy-carbide (SiOC) material. In another example the second dielectric material, 433-1, 433-2, ..., 433-N, may include silicon oxy-nitride (SiON), and/or combinations thereof. Embodiments are not limited to these examples. However, according to embodiments, the second dielectric material, 433-1, 433-2, ..., 433-N, is purposefully chosen to be different in material or composition than the first dielectric material, 430-1, 430-2, ..., 430-N, such that a selective etch process may be performed on one of the first and second dielectric layers, selective to the other one of the first and the second dielectric layers, e.g., the second SiN dielectric material, 433-1, 433-2, ..., 433-N, may be selectively etched relative to the semiconductor material, 432-1, 432-2, ..., 432-N, and a first oxide dielectric material, 430-1, 430-2, ..., 430-N.

Again, the repeating iterations of alternating first dielectric material, 430-1, 430-2, ..., 430-N layers, semiconductor material, 432-1, 432-2, ..., 432-N layers, and second dielectric material, 433-1, 433-2, ..., 433-N layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a first dielectric material, a semiconductor material, and a second dielectric material, in repeating iterations to form the vertical stack 401.

The layers may occur in repeating iterations vertically. In the example of FIG. 4A, three tiers, numbered 1, 2, and 3, of the repeating iterations are shown. For example, the stack may include: a first dielectric material 430-1, a semiconductor material 432-1, a second dielectric material 433-1, a third dielectric material 430-2, a second semiconductor material 432-2, a fourth dielectric material 433-2, a fifth dielectric material 430-3, a third semiconductor material 432-3, and a sixth dielectric material 433-3. As such, a stack may include: a first oxide material 430-1, a first semiconductor material 432-1, a first nitride material 433-1, a second oxide material 430-2, a second semiconductor material 432-2, a second nitride material 433-2, a third oxide material 430-3, a third semiconductor material 432-3, and a third nitride material 433-3 in further repeating iterations. Embodiments, however, are not limited to this example and more or fewer repeating iterations may be included.

Figure 4B:
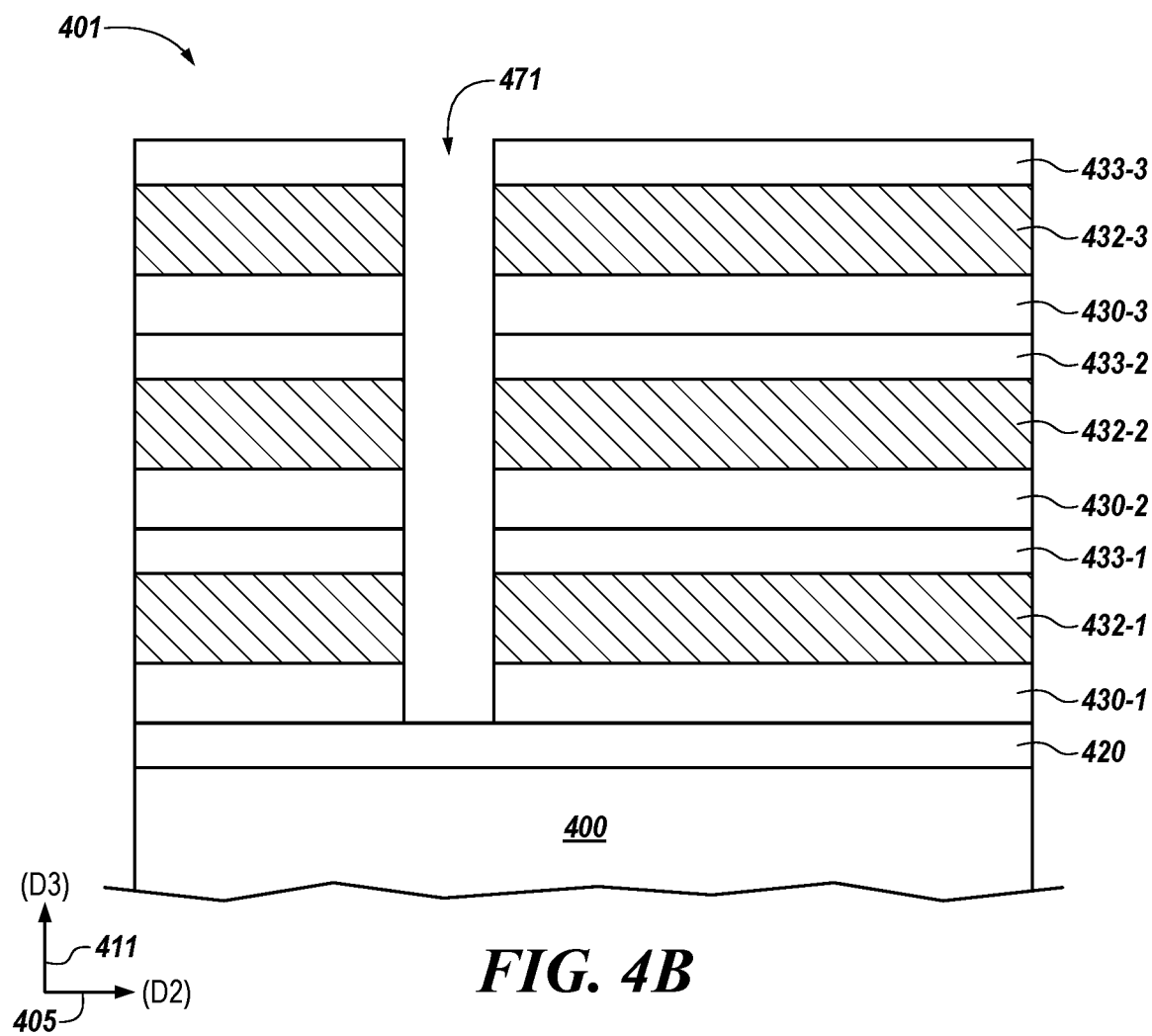

FIG. 4B is a is a cross-sectional view, at another stage of the semiconductor fabrication process, for forming arrays of vertically stacked memory, cells to form a channel and body region of a horizontally oriented access device, e.g., transistor, in accordance with a number of embodiments of the present disclosure.

According to embodiments, the semiconductor fabrication process described in FIGS. 4B-4F can occur after an elongated pillar extending predominantly in a second direction and access line formation such as shown in FIGS. 5A-6E have been performed. According to embodiments, the methods in FIG. 4A-4F can convert the semiconductor material 432, e.g., a low doped (p−) polysilicon material, to a single crystalline structure.

As shown in FIG. 4B, a vertical opening 471 may be formed through the layers within the vertically stacked memory cells to expose vertical sidewalls in the vertical stack 401. The opening 471 may be formed through the alternating repeating iterations using a first etchant process to form the opening 471 adjacent a first region, e.g., 742 in FIG. 7C, of the semiconductor material 432, e.g., polysilicon (poly-Si). The vertical opening 471 may be formed through the repeating iterations of the oxide material 430, the semiconductor material 432, and the nitride material 433. As such, the vertical opening 471 may be formed through the first oxide material 430-1, the first semiconductor material 432-1, the first nitride material 433-1, the second oxide material 430-2, the second semiconductor material 432-2, the second nitride material 433-2, the third oxide material 430-3, the third semiconductor material 432-3, and the third nitride material 433-3. Embodiments, however, are not limited to the single vertical opening 471 shown in FIG. 4B. Multiple vertical openings may be formed through the layers of materials. The vertical opening 471 may be formed to expose vertical sidewalls in the vertical stack 401. In one example, a working surface of the substrate 400 may be masked and patterned to form the vertical opening 471 to have a width in a range of fifty (50) nanometers (nm) to five hundred (500) nm and a depth in a range of five hundred (500) nm to twenty thousand (20,000) nm. Embodiments, however, are not limited to this example.

Figure 4C:
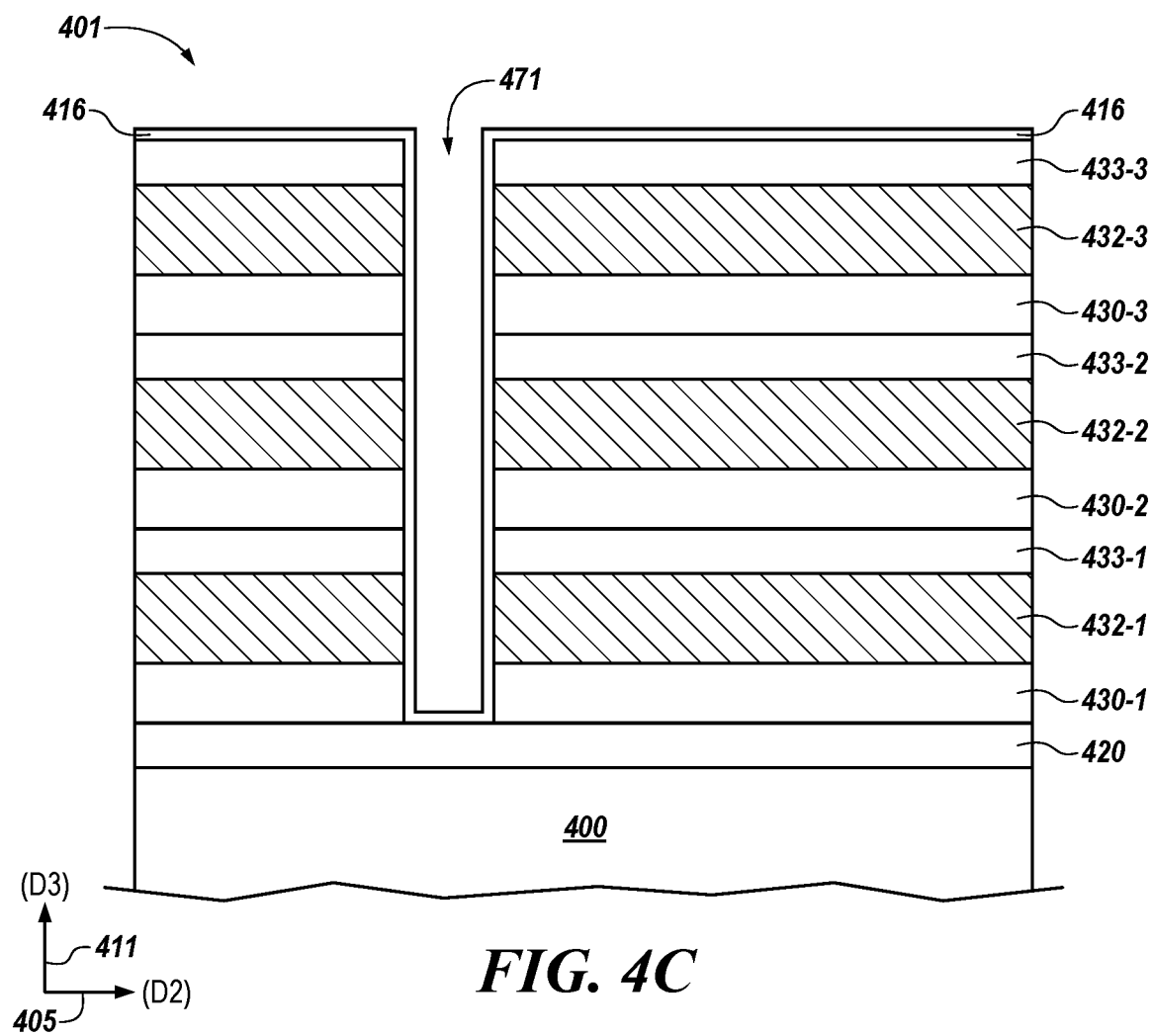

FIG. 4C is a cross-sectional view, at another stage of the semiconductor fabrication process, for forming arrays of vertically stacked memory cells having vertically oriented access lines, to form a channel and body region of a horizontally oriented access device, in accordance with a number of embodiments of the present disclosure.

As shown in FIG. 4C, a metal, e.g., seed, material 416 may be deposited over the vertical stack 401, the sidewalls of the vertical opening 471, and the bottom of the vertical opening 471. In some embodiments, the metal material 416 may be deposited using an atomic layer deposition (ALD) process. In one embodiment the metal material 416 is a nickel (Ni) metal material 416. In this example the nickel (Ni) metal material 416 may be selectively deposited to form a Ni silicide (NiSi) 416 with the silicon material 432. In one example, the metal material 416, e.g., seed material, may be deposited to a thickness (t1) in a range of approximately 5-50 angstroms (Å). Embodiments, however, are not limited to these examples. In some embodiments, the metal material 416 comprises a metal that can form a silicide with a silicon (Si) material, e.g., polysilicon material 432.

Figure 4D:
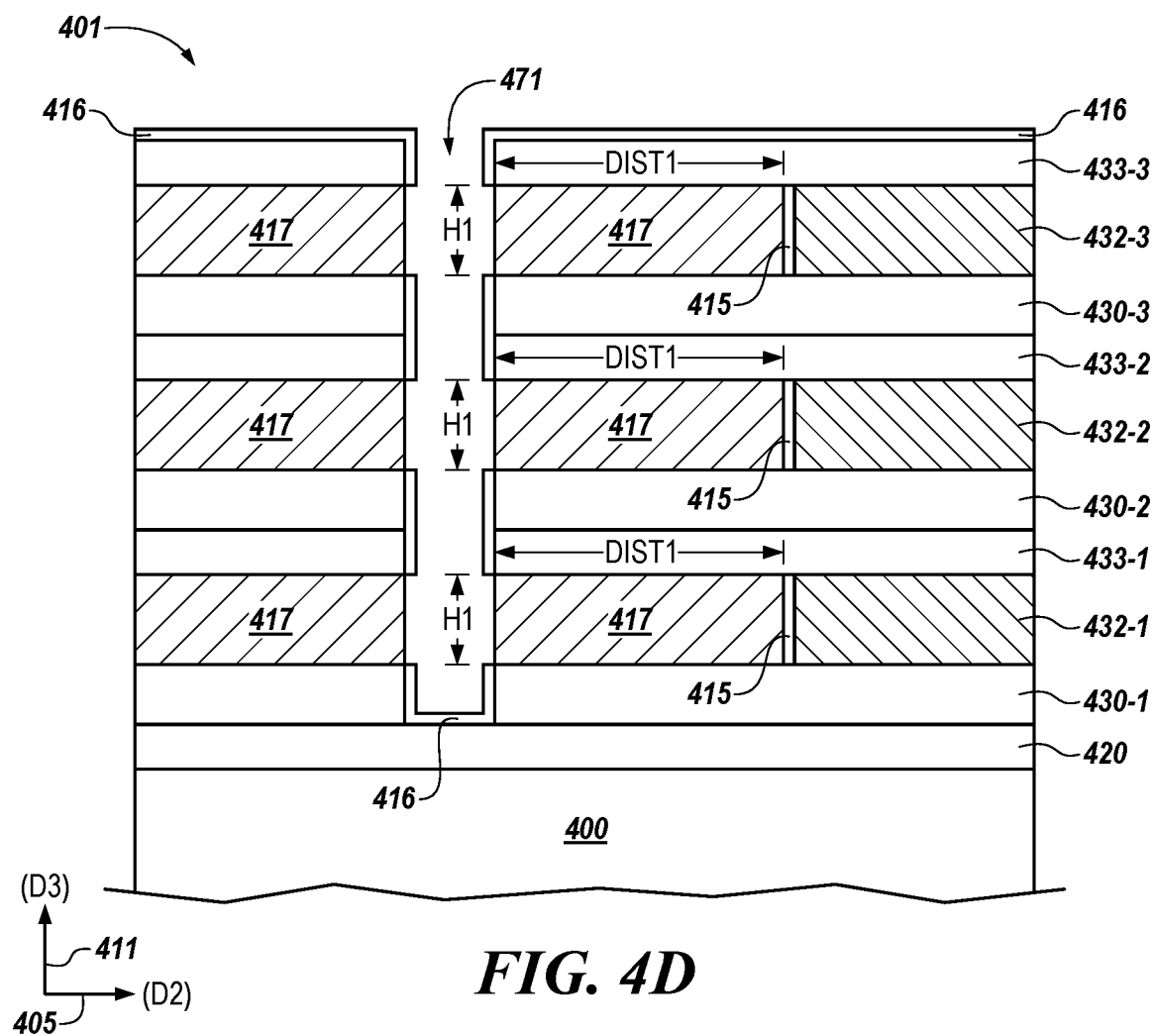

FIG. 4D is a cross-sectional view, at another stage of the semiconductor fabrication process, for forming arrays of vertically stacked memory cells having vertically oriented access lines, to form a channel and body region for a horizontally oriented access device, in accordance with a number of embodiments of the present disclosure.

In the example embodiment of FIG. 4D, the vertical stack 401 may be processed under temperature, pressure, and time parameters such that as the metal material 416 advances horizontally within a portion of the semiconductor material 432 and transforms the crystalline structure of the portion of the semiconductor material 432 into a large grain size poly crystalline material 417, e.g., monocrystalline semiconductor material, according to a metal induced lateral crystalline (MILC), solid phase crystallization (SPC) process. As the metal material 416 advances through the semiconductor material 432 as a result of an annealing process at elevated temperatures, the metal material 416 may acquire silicon atoms from the semiconductor material 432 and become a metal silicide material 415. In some embodiments, the metal silicide material 415 may be a Nickel silicide material, a Cobalt silicide material, or a Silver silicide material. The metal silicide material 415 may advance through the semi-conductor material 432 as a result of a chemical reaction between the metal silicide material 415 and the semiconductor material 432. The speed at which the metal silicide material 415 advances through the semiconductor material 432 may be controlled by adjusting the temperature applied to the vertical stack 401 and the metal silicide material 415. In some embodiments, the vertical stack 401 is processed at a temperature in a range of 400 to 600 degrees Celsius (° C.) such that the metal silicide material 415 advances horizontally through the semiconductor material 432, e.g., polysilicon, transforming the portion of the semiconductor material 432 to monocrystalline semiconductor material 417.

In some embodiments, a distance (DIST1) to which the metal silicide material 415 advances horizontally within the portion of the semiconductor material 432 is determined by a number of factors such as a thickness (H1), e.g., vertical height, of the semiconductor material 432 layer, a thickness of the metal material, e.g., seed material, deposited on the vertical sidewalls, and first region of the semiconductor material 432, in the vertical opening 471 of the vertical stack 401, and a temperature. In some embodiments, the distance (DIST1) to which the metal silicide material 415 advances horizontally within the portion of the semiconductor material 432, transforming the portion of the semiconductor material 432 to monocrystalline semiconductor material 417, may be controlled by adjusting the temperature applied to the vertical stack 401 and the metal silicide material 415 in the process, as well as adjusting the amount of time in which that temperature is applied.

In some embodiments, at an applied temperature of less than 600 degrees Celsius (° C.), a thickness (H1), e.g., vertical height, of the semiconductor material 432 layer in a range of twenty (20) nm to one hundred (100) nm, and for a metal material 416, e.g., seed material, deposited to a thickness (t1) in a range of approximately 5-50 angstroms (Å), the time and process parameters are controlled such that the metal silicide 415 advances horizontally through the silicon material 432, transforming the portion of the semiconductor material 432 to monocrystalline semiconductor material 417, a first distance (DIST1) in a range of 100 nanometers (nm) to 300 nm. In one embodiment, the metal silicide 415 advances horizontally through the silicon material 432, transforming the portion of the semiconductor material 432 to a large grain polycrystalline silicon and/or monocrystalline silicon structure 417, a first distance (DIST1) of at least 200 nanometers (nm). In some embodiments, the process may be performed, under the design rules described herein, at a temperature as low as 400 degrees Celsius (° C.).

In some embodiments, under the above described process parameters, the metal silicide 415 advances in a diagonal-horizontal progression through the silicon material 432, transforming the portion of the semiconductor material 432 to a large grain polycrystalline silicon and/or monocrystalline silicon structure 417. However, such diagonal-horizontal advancement is bounded by the first dielectric material 430, e.g., as floor in a vertical direction (third direction (D3), and by the second dielectric material 433, e.g., as a ceiling in a vertical direction, such that the advancement of the metal silicide 415 continues to progress horizontally in a second direction (D2) for a distance (DIST1) and at a height (H1) within the semiconductor material 432, transforming the portion of the semiconductor material 432 to a large grain polycrystalline silicon and/or monocrystalline silicon structure 417, in a direction moving away from the vertical opening 471.

In some embodiments, the metal 416, e.g., seed material, may be deposited in a second vertical opening, e.g., 751 in FIG. 7C, through the vertical stack 400 which is opened in a second region, e.g., 744 in 7C, to eventually form storage nodes. Using a similar process and processing parameter control techniques to those described above, a resulting metal silicide 415 may progress horizontally through the semiconductor material 432 in a direction moving away from the second vertical opening, e.g., 751 in FIG. 7C, which is a side of the vertical stack 401 that will include a storage node to be formed adjacent and in the second vertical opening and in the second region, e.g., 744. In these embodiments, the metal silicide material 415 may move through the semiconductor material 432 in a direction toward the first opening 471. Embodiments, however, are not limited to these examples.

In one embodiment, the metal silicide 415 continues to progress horizontally in a second direction (D2) for a distance (DIST1) and at a height (H1) within the semiconductor material 432, transforming the portion of the semiconductor material 432 to a large grain polycrystalline silicon and/or monocrystalline silicon structure 417, along a <100> crystalline plane orientation or a crystalline plane orientation that is close to a <100> crystalline plane orientation. Embodiments, however, are not limited to this example. In some embodiments, a better monocrystalline uniformity is achieved a further distance the metal silicide 415 progresses from the initial metal 416, e.g., seed material, deposition location.

According to some embodiments, the resulting, transformed portion of the silicon crystalline material 417 is a substantially monocrystalline silicon structure such that grain boundaries (GB) of the crystalline structure are mostly sub-grain boundaries (sub-GB) and such that the transformed portion of the silicon crystalline material 417 has approximately less than (<) one degree (1°) of crystalline orientation difference. In one embodiment, the large grain polycrystalline and/or substantially monocrystalline silicon crystalline material 417 has a concentration of grain boundary defects of less than one defect in $1\times10^{18}$ cubic centimeters (also referred to as centimeters cubed ($cm^3$). For example, according to embodiments, the vertical stack 401 may be processed under temperature, deposition thickness, and time parameters to horizontally advance the metal silicide 415, recrystallizing the polysilicon and/or amorphous silicon semiconductor material 432 into a substantially monocrystalline silicon structure 417 having mostly sub-grain boundaries (sub-GB). Stated otherwise, according to embodiments described herein, the poly and/or amorphous silicon semiconductor material 432 is recrystallized into a substantially monocrystalline silicon structure 417 such that grain boundaries within the monocrystalline silicon structure 417 have a crystalline orientation difference of less than one degree (1°). Again, in some embodiments, the defect density of the monocrystalline silicon structure 417 may be less than one defect in $1\times10^{18}$ centimeters cubed ($cm^3$) of the monocrystalline silicon structure 417.

In result, a better crystalline structure for a channel and body region of a horizontally oriented access device is provided with better electron mobility due to large grain size and low grain boundary (GB) density. For example, a lower GB trap density may be realized, and less electron hole pair generation may occur resulting in a lower "off" current ("Ioff") for the horizontally oriented access device under the described design rules and scale. Also, better uniformity, with an improved tail bit growth profile, may be achieved as compared to other low temperature chemical vapor deposition (CVD) of amorphous silicon:hydrogen (a-Si:H) film deposition processes in forming, e.g., depositing, the semiconductor material 432.

As noted, in some embodiments, the metal material 415 may transform the semiconductor material 432 into the crystalline material 417 using metal induced lateral crystallization (MILC). MILC may be a more effective process of recrystallization when applied to amorphous silicon in comparison to applying MILC to polysilicon. MILC may be less effective when it is applied to polysilicon because the grain boundaries in polysilicon may impede the movement of a metal silicide, e.g., metal silicide material 415, through the polysilicon during the recrystallization process. Due to the grain boundaries in the polysilicon material impeding the movement of the metal silicide through the polysilicon material, the speed of the crystal growth in the polysilicon material during MILC may be slower than the speed of crystal growth in amorphous silicon material during MILC. Further, polysilicon is more stable than amorphous silicon, therefore, the amount of energy required to recrystallize polysilicon is greater than the amount of energy required to recrystallize amorphous silicon.

In some embodiments, the MILC may occur at a temperature less than 450 degrees ° C. In some embodiments, the metal silicide material 415 may transform the semiconductor material 432 into the crystalline material 417 using solid phase crystallization (SPC). The vertical stack 401 may be processed under temperature and time parameters such that, as the metal silicide material 415 advances within the semiconductor material 432, it transforms the crystalline structure of a portion of the semiconductor material 432 according to increasing a size of individual crystals in that portion of the semiconductor material 432.

After advancing through the semiconductor material 432, the vertical stack 401 may be processed to form other semiconductor components, e.g., storage nodes, digit lines, vertical access lines, etc., and/or discrete regions such as source/drain regions. In some embodiments, and by way of example and not by way of limitation, the metal silicide material 415 that remains has a very low defect concentration and/or impurity. Further, as the metal silicide 415 advances through the silicon material 432 a first distance, e.g., DIST1, it may provide a dividing interface between the monocrystalline silicon 417 and the remaining, un-transformed and/or recrystallized semiconductor material 432, e.g., amorphous silicon, wherein the crystals of the monocrystalline side of the interface are larger than the crystals in the amorphous silicon structure 432 and such that after crystallization very low metal impurity from the metal material 416, e.g., seed material, remains in the semiconductor material 432, e.g., polysilicon.

As will be described in more detail below, the recrystallized monocrystalline silicon structure 417 may be used in the first region for formation of a horizontally oriented access device in the vertical stack 401. In some embodiments, the remaining metal silicide material 415, now a first distance (D1) from the vertical opening 471, may serve as an etch stop while selectively removing the semiconductor material 432 from a second region of the vertical stack 401 for formation of a storage node. For example, a horizontal capacitor cell may be formed in the selectively removed semiconductor material 432 in the second region using an ALD process.

As noted, the vertical stack 401 is processed such that the metal silicide material 415 advances horizontally through the silicon material a first distance (DIST1) and provides a dividing interface between the transformed, monocrystalline silicon 417 and the crystalline structure of the remaining semiconductor material 432. The crystals on the monocrystalline side 417 of the interface are larger than the crystals in the remaining semiconductor material 432 structure. Due to the larger crystals in the transformed material 417 in comparison to a non-metal silicide formation process, e.g., MILC/SPC process, for the remaining amorphous and/or poly-silicon semiconductor material 432, the transformed crystalline material 417 may provide an improved channel and body region, e.g., 325 in FIG. 3, with better electron mobility and less "off" current ("Ioff") leakage than a channel and body region formed using the deposited semiconductor material 432. Again, in some embodiments, a thickness (H1), e.g., vertical height, of a channel and body region (325 in FIG. 3) formed from the transformed crystalline material 417 may be in a range of approximately twenty (20) nm to one hundred (100) nm. In some embodiments, the remaining, non-transformed, semiconductor material 432, on the side of the interface in a horizontal direction away from the vertical opening 471, may be sacrificially removed to form a horizontal opening for formation of a horizontally oriented storage node for the vertically stacked memory cells having vertically oriented access lines. For example, in some embodiments, any remaining metal silicide material 415 may be used as an etch stop to sacrificial removal of the semiconductor material 432 and/or as an ohmic contact to a first electrode of a capacitor formed in a second region of the vertical stack 401 as a storage node.

Figure 4E:
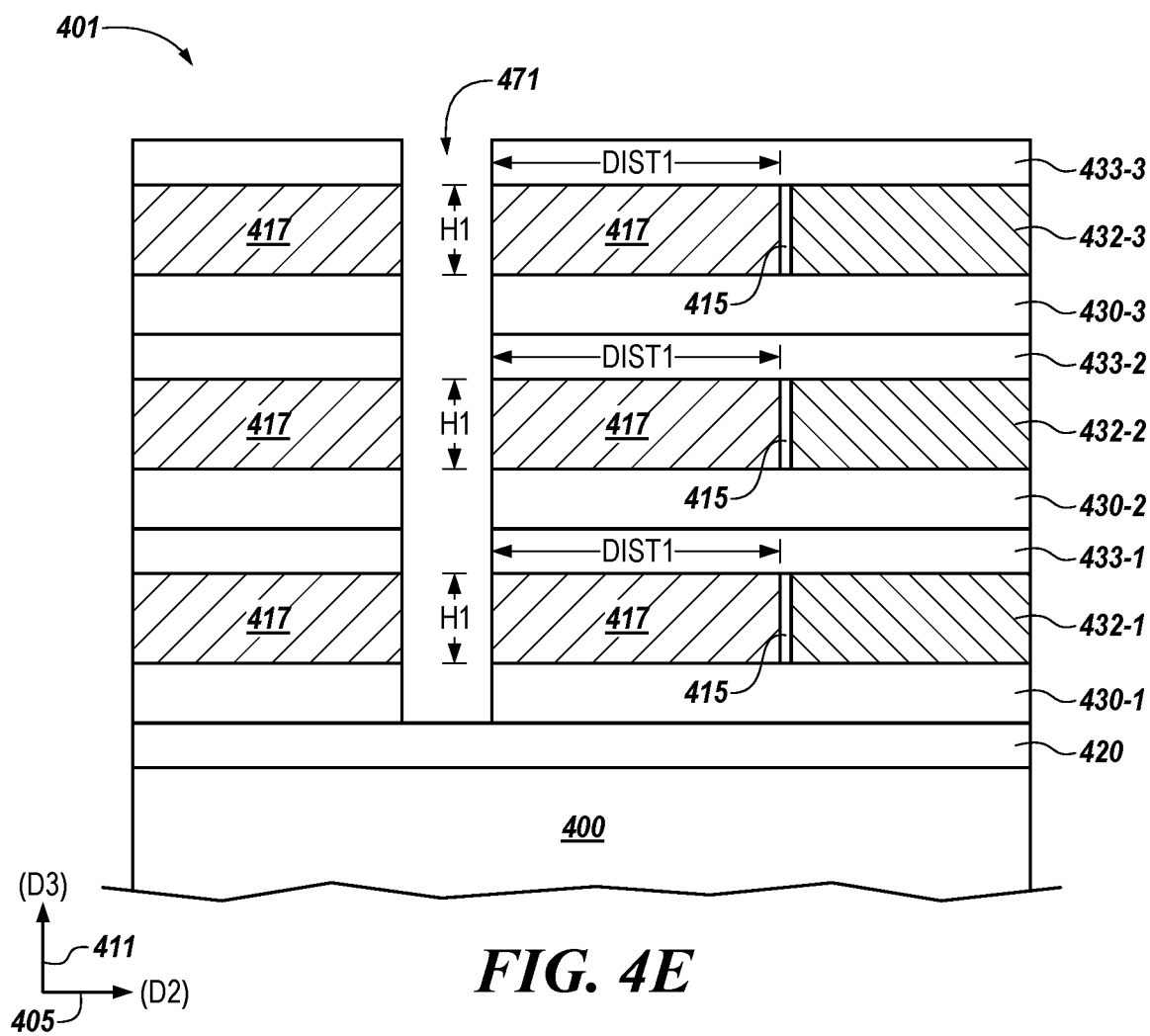

FIG. 4E is a cross-sectional view, at another stage of the semiconductor fabrication process, for forming arrays of vertically stacked memory cells, to form a channel and body region of a horizontally oriented access device, in accordance with a number of embodiments of the present disclosure.

As shown in the example of FIG. 4E, the metal material 416 that did not advance within the semiconductor material 432 may remain on vertical sidewalls of the first dielectric material 430 and the second dielectric material 433 in the vertical opening 471 and on a bottom surface of the vertical opening 471 of the vertical stack 401 as can be seen in FIG. 4D. Therefore, in one embodiment, as shown in FIG. 4E, an isotropic etch process clean may be performed in the vertical opening 471 on the vertical stack 401, e.g., on the sidewalls and bottom of the vertical opening 471 to remove residual, remaining metal material 416 from those surfaces. Removing the metal material 416 from such surfaces in the vertical opening 471 of the vertical stack 401, e.g., sidewalls and bottom of the vertical opening 471, may preserve an original aspect ratio (A/R), vertical height to width ratio, of the vertical opening 471 for subsequent material deposition therein in subsequent semiconductor fabrication processes described herein. In some embodiments, the A/R may be in a range of ten (10) to forty (40). In some embodiments, the A/R may be in a range of 40 nm to 150 nm.

Figure 4F:
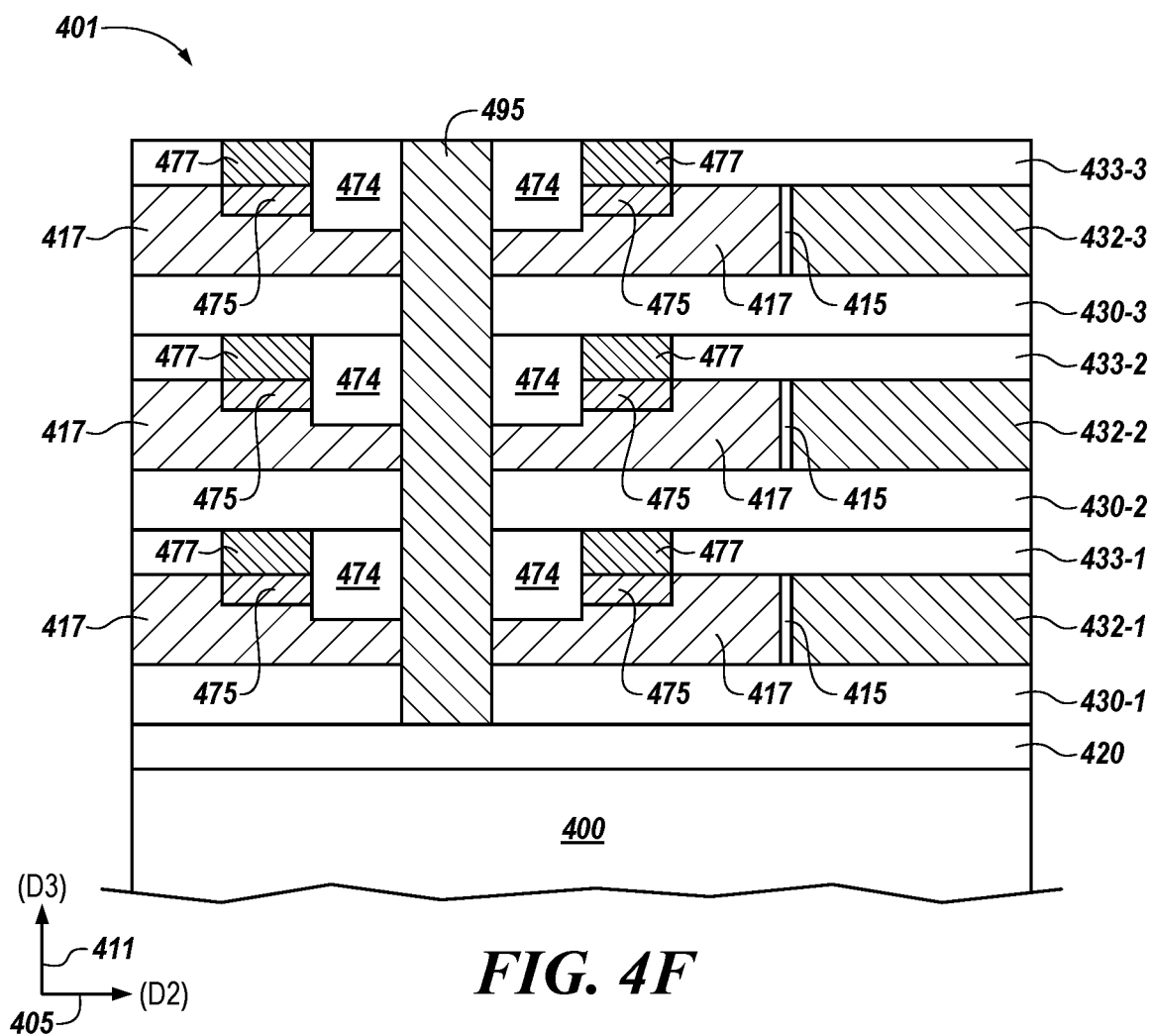

FIG. 4F is a cross-sectional view, at another stage of the semiconductor fabrication process, for forming arrays of vertically stacked memory cells, to form a channel and body region of a horizontally oriented access device, in accordance with a number of embodiments of the present disclosure.

As shown in the example embodiment of FIG. 4F, subsequent semiconductor fabrication processes may be performed to selectively remove a sacrificial portion of the second dielectric material 433, use gas phase doping to deposit a first source/drain region in a top surface of the transformed, crystalline material 417, deposit a conductive digit line material in electrical contact with the first source/drain region, provide an isolation barrier, and deposit a body contact 495 material in the vertical opening to form a device structure as shown in FIG. 3.

In the example of FIG. 4F, the digit lines 477 may be horizontally oriented digit lines 477, 207 shown in FIG. 2, extending in a first direction (D1), running in to and out from the plane of the drawing sheet in FIG. 4F. One example of forming a first source/drain region in a top surface of the transformed, crystalline material 417, a conductive digit line material in electrical contact with the first source/drain region, an isolation barrier, and a body contact 495 material is described in co-pending U.S. patent application Ser. No. 16/943,494, entitled "Digit Line and Body Contact for Semiconductor Devices", having at least one common inventor, and filed on Jul. 30, 2020. Another example is provided in co-pending U.S. patent application Ser. No. 16/943,163, entitled "Underbody Contact to Horizontal Access Devices for Vertical Three-Dimensional (3D) Memory", having at least one common inventor, and filed on Jul. 30, 2020. Another example is provided in co-pending U.S. patent application Ser. No. 16/943,108, entitled "Digit Line Formation for Horizontally Oriented Access Devices", having at least one common inventor, and filed on Jul. 30, 2020. All of which are incorporated in full herein by reference.

FIG. 5A illustrate an example method, at another stage of a semiconductor fabrication process, for forming arrays of vertically stacked memory cells having a channel and body region for semiconductor devices and vertically oriented access lines, in accordance with a number of embodiments of the present disclosure. FIG. 5A illustrates a top down view of a semiconductor structure, at a particular point in time, in a semiconductor fabrication process, according to one or more embodiments. In the example embodiment shown in the example of FIG. 5A, the method comprises using an etchant process to form a plurality of first vertical openings 500, having a first horizontal direction (D1) 509 and a second horizontal direction (D2) 505, through the vertical stack to the substrate. In one example, as shown in FIG. 5A, the plurality of first vertical openings 500 are extending predominantly in the second horizontal direction (D2) 505 and may form elongated vertical, pillar columns 513 with sidewalls 514 in the vertical stack. The plurality of first vertical openings 500 may be formed using photolithographic techniques to pattern a photolithographic mask 535, e.g., to form a hard mask (HM), on the vertical stack prior to etching the plurality of first vertical openings 500.

FIG. 5B is a cross sectional view, taken along cut-line A-A' in FIG. 5A, showing another view of the semiconductor structure at a particular time in the semiconductor fabrication process. The cross sectional view shown in FIG. 5B shows the repeating iterations of alternating layers of a first dielectric material, 530-1, 530-2, . . . , 530-N, a semiconductor material, 532-1, 532-2, . . . , 532-N, and a second dielectric material, 533-1, 533-2, . . . , 533-N, on a semiconductor substrate 500 to form the vertical stack, e.g. 401 as shown in FIG. 4. FIG. 5B illustrates that a conductive material, 540-1, 540-2, . . . , 540-4, may be formed on a gate dielectric material 538 in the plurality of first vertical openings 500. By way of example and not by way of limitation, a gate dielectric material 538 may be conformally deposited in the plurality of first vertical openings 500 using a chemical vapor deposition (CVD) process, plasma enhanced CVD (PECVD), atomic layer deposition (ALD), or other suitable deposition process, to cover a bottom surface and the vertical sidewalls of the plurality of first vertical openings. The gate dielectric 538 may be deposited to a particular thickness (t1) as suited to a particular design rule, e.g., a gate dielectric thickness of approximately 10 nanometers (nm). Embodiments, however, are not limited to this example. By way of example, and not by way of limitation, the gate dielectric 538 may comprise a silicon dioxide ($SiO_2$) material, aluminum oxide ($Al_2O_3$) material, high dielectric constant (k), e.g., high-k, dielectric material, and/or combinations thereof as also described in FIG. 3.

Further, as shown in FIG. 5B, a conductive material, 540-1, 540-2, . . . , 540-4, may be conformally deposited in the plurality of first vertical openings 500 on a surface of the gate dielectric material 538. By way of example, and not by way of limitation, the conductive material, 540-1, 540-2, . . . , 540-4, may be conformally deposited in the plurality of first vertical openings 500 on a surface of the gate dielectric material 538 using a chemical vapor deposition process (CVD), plasma enhanced CVD (PECVD), atomic layer deposition (ALD), or other suitable deposition process, to cover a bottom surface and the vertical sidewalls of the plurality of first vertical openings over the gate dielectric 538. The conductive material, 540-1, 540-2, . . . , 540-4, may be conformally deposited to a particular thickness (t2) to form vertically oriented access lines, such as shown as access lines 103-1, 103-2, . . . , 103-Q (which also may be referred to a word lines) shown in FIG. 1, et. seq., and as suited to a particular design rule. For example, the conductive material, 540-1, 540-2, . . . , 540-4, may be conformally deposited to a thickness of approximately 20 nanometers (nm). Embodiments, however, are not limited to this example. By way of example, and not by way of limitation, the conductive material, 540-1, 540-2, . . . , 540-4, may be comprise a metal such as tungsten (W), metal composition, titanium nitride (TiN), doped amorphous silicon, and/or some other combination thereof as also described in FIG. 3.

As shown in FIG. 5B, the conductive material, 540-1, 540-2, . . . , 540-4, may be recessed back to remain only along the vertical sidewalls of the elongated vertical, pillar columns, now shown as 542-1, 542-2, and 542-3 in the cross-sectional view of FIG. 5B. The plurality of separate, vertical access lines formed from the conductive material, 540-1, 540-2, . . . , 540-4, may be recessed back by using a suitable selective, anisotropic etch process to remove the conductive material, 540-1, 540-2, . . . , 540-4, from a bottom surface of the first vertical openings, e.g., 500 in FIG. 5A, exposing the gate dielectric 538 on the bottom surface to form separate, vertical access lines, 540-1, 540-2, . . . , 540-4. As shown in FIG. 5B, a dielectric material 539, such as an oxide or other suitable spin on dielectric (SOD), may then be deposited in the first vertical openings 500, using a process such as CVD, to fill the first vertical openings 500. The dielectric may be planarized to a top surface of the hard mask 535 of the vertical semiconductor stack, using chemical mechanical planarization (CMP) or other suitable semiconductor fabrication technique. A subsequent photolithographic material 536, e.g., hard mask, may be deposited using CVD and planarized using CMP to cover and close the first vertical openings 500 over the separate, vertical access lines, 540-1, 540-2, . . . , 540-4. Similar semiconductor process techniques may be used at other points of the semiconductor fabrication process described herein.

FIG. 6A illustrates an example method, at another stage of a semiconductor fabrication process, for forming arrays of vertically stacked memory cells having a channel and body region for semiconductor devices, in accordance with a number of embodiments of the present disclosure. FIG. 6A illustrates a top down view of a semiconductor structure, at a particular point in time, in a semiconductor fabrication process, according to one or more embodiments. In the example embodiment of FIG. 6A, the method comprises using a photolithographic process to pattern the photolithographic mask 636, 536 in FIG. 5B. The method in FIG. 6A, further illustrates using a selective, isotropic etchant process to remove portions of the exposed conductive material, 640-1, 640-2, . . . , 640-N, 640-(N+1), . . . , 640-(Z−1), and 640-Z, to separate and individually form the plurality of separate, vertical access lines, 640-1, 640-2, . . . , 640-N, 640-(N+1), . . . , 640-(Z−1), and 640-Z, e.g., access lines 103-1, 103-2, . . . , 103-Q in FIG. 1, et. seq. Hence the plurality of separate, vertical access lines, 640-1, 640-2, . . . , 640-N, 640-(N+1), . . . , 640-(Z−1), and 640-Z, are shown along the sidewalls of the elongated vertical, pillar columns, e.g., along sidewalls of the elongated vertical, pillar columns 542-1, 542-2, and 542-3 in the cross-sectional view of FIG. 5B.

As shown in the example of FIG. 6A, the exposed conductive material, 640-1, 640-2, . . . , 640-N, 640-(N+1), . . . , 640-(Z−1), and 640-Z, may be removed back to the gate dielectric material 638, in the first vertical openings, e.g., 500 in FIG. 5A, using a suitable selective, isotropic etch process. As shown in FIG. 6A, a subsequent dielectric material 641, such as an oxide or other suitable spin on dielectric (SOD), may then be deposited to fill the remaining openings from where the exposed conductive material, 640-1, 640-2, . . . , 640-N, 640-(N+1), . . . , 640-(Z−1), and 640-Z, was removed using a process such as CVD, or other suitable technique. The dielectric material 641 may be planarized to a top surface of the previous hard mask 635 of the vertical semiconductor stack, e.g., 401 as shown in FIG. 4, using a process such as CMP, or other suitable technique. In some embodiments, a subsequent photolithographic material 637, e.g., hard mask, may be deposited using CVD and planarized using CMP to cover and close the plurality of separate, vertical access lines, 640-1, 640-2, . . . , 640-N, 640-(N+1), . . . , 640-(Z−1), and 640-Z, over a working surface of the vertical semiconductor stack, 401 in FIG. 4, leaving the plurality of separate, vertical access lines, 640-1, 640-2, . . . , 640-N, 640-(N+1), . . . , 640-(Z−1), and 640-Z, protected along the sidewalls of the elongated vertical, pillar columns. Embodiments, however, are not limited to these process examples.

FIG. 6B illustrates a cross sectional view, taken along cut-line A-A' in FIG. 6A, showing another view of the semiconductor structure at this particular point in one example semiconductor fabrication process of an embodiment of the present disclosure. The cross sectional view shown in FIG. 6B is away from the plurality of separate, vertical access lines, 640-1, 640-2, . . . , 640-N, 640-(N+1), . . . , 640-(Z−1), and shows the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N, on a semiconductor substrate 600 to form the vertical stack, e.g. 401 as shown in FIG. 4. As shown in FIG. 6B, a vertical direction 611 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 609. In the example embodiment of FIG. 6B, the dielectric material 641 is shown filling the vertical openings on the residual gate dielectric 638 deposition. The hard mask 637, described above, caps the illustrated structure.

FIG. 6C illustrates a cross sectional view, taken along cut-line B-B' in FIG. 6A, showing another view of the semiconductor structure at this particular point in one example semiconductor fabrication process of an embodiment of the present disclosure. The cross sectional view shown in FIG. 6C is illustrated extending in the second direction (D2) 605 along an axis of the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N, along and in which the horizontally oriented access devices and horizontally oriented storage nodes, e.g., capacitor cells, can be formed within the layers of semiconductor material, 632-1, 632-2, . . . , 632-N. In FIG. 6C, a neighboring, opposing vertical access line 640-3 is illustrated by a dashed line indicating a location set in from the plane and orientation of the drawing sheet.

FIG. 6D illustrates a cross sectional view, taken along cut-line C-C' in FIG. 6A, showing another view of the semiconductor structure at this particular point in one example semiconductor fabrication process of an embodiment of the present disclosure. The cross sectional view shown in FIG. 6D is illustrated extending in the second direction (D2) 605 along an axis of the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N, outside of a region in which the horizontally oriented access devices and horizontally oriented storage nodes, e.g., capacitor cells, will be formed within the layers of semiconductor material, 632-1, 632-2, . . . , 632-N. In FIG. 6C, the dielectric material 641 is shown filling the space between the horizontally oriented access devices and horizontally oriented storage nodes, which can be spaced along a first direction (D1) 611, extending into and out from the plane of the drawings sheet, for a three dimensional array of vertically oriented memory cells. At the left end of the drawing sheet is shown the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N, at which location a horizontally oriented digit line, e.g., digit lines 107-1, 107-2, . . . , 107-P shown in FIG. 1, et. seq., can be integrated to form electrical contact with the second source/drain regions or digit line conductive contact material, described in more detail below.

FIG. 6E illustrates a cross sectional view, taken along cut-line D-D' in FIG. 6A, showing another view of the semiconductor structure at this particular point in one example semiconductor fabrication process of an embodiment of the present disclosure. The cross sectional view shown in FIG. 6E is illustrated, right to left in the plane of the drawing sheet, extending in the first direction (D1) 609 along an axis of the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N, intersecting across the plurality of separate, vertical access lines, 640-1, 640-2, . . . , 640-N, 640-(N+1), . . . , 640-(Z−1), and intersecting regions of the semiconductor material, 632-1, 632-2, . . . , 632-N, in which a channel and body region may be formed, separated from the plurality of separate, vertical access lines, 640-1, 640-2, . . . , 640-N, 640-(N+1), . . . , 640-(Z−1), by the gate dielectric 638. In FIG. 6E, the first dielectric fill material 639 is shown separating the space between neighboring horizontally oriented access devices and horizontally oriented storage nodes, which may be formed extending into and out from the plane of the drawing sheet as described in more detail below, and can be spaced along a first direction (D1) 609 and stacked vertically in arrays extending in the third direction (D3) 611 in the three dimensional (3D) memory.

Figure 7A:
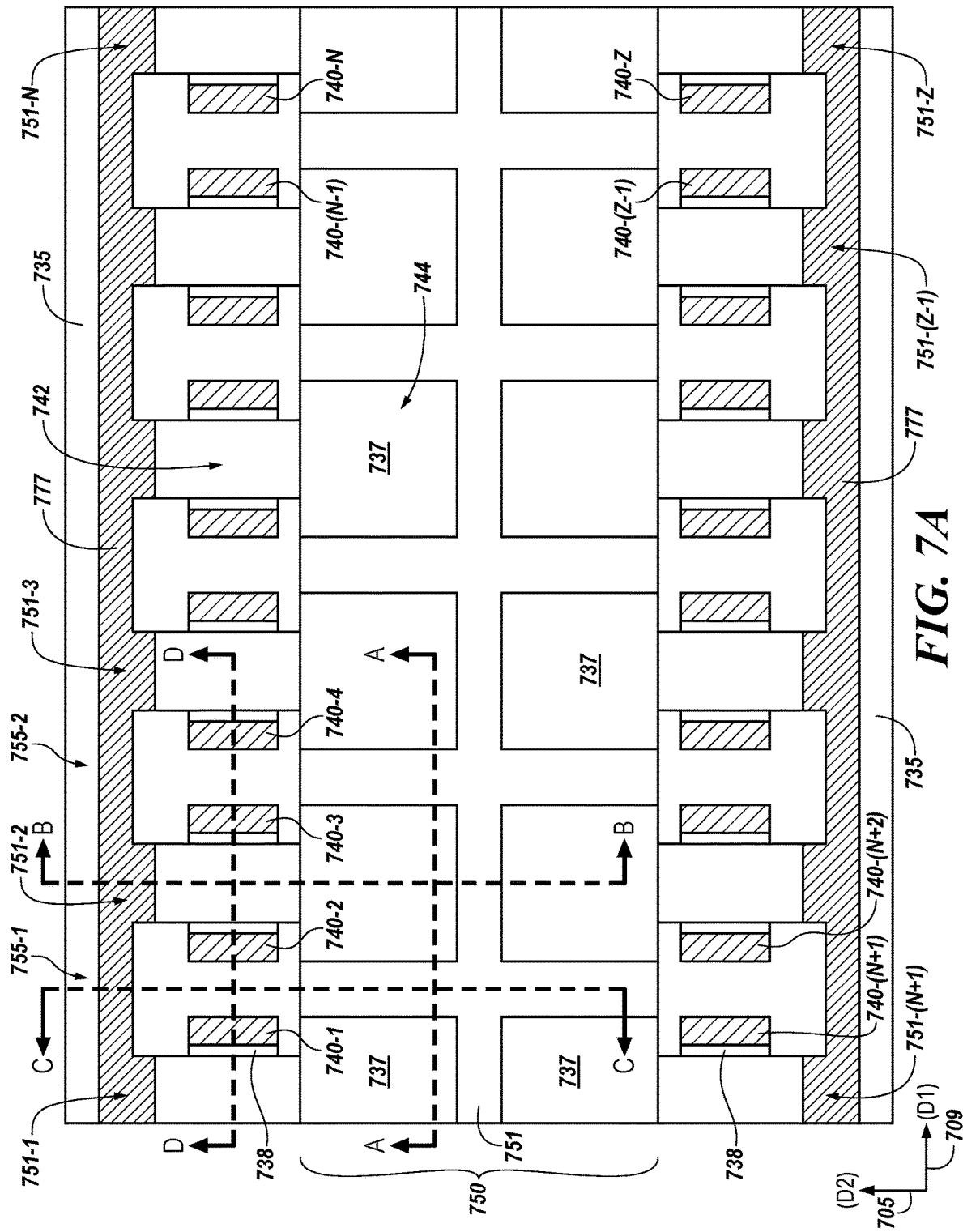

FIG. 7A illustrates an example method, at another stage of a semiconductor fabrication process, for forming arrays of vertically stacked memory cells having a channel and body region for semiconductor devices, in accordance with a number of embodiments of the present disclosure. FIG. 7A illustrates a top down view of a semiconductor structure, at a particular point in time, in a semiconductor fabrication process, according to one or more embodiments. In the example embodiment of FIG. 7A, the method comprises using a photolithographic process to pattern the photolithographic masks 735, 736 and/or 737, e.g., 635, 636, and/or 637 in FIGS. 6A-6E. The method in FIG. 7A, further illustrates using one or more etchant processes to form a vertical opening 751-1, 751-N, 751-(N+1), and 751-Z (individually or collectively referred to as vertical opening 751) in a storage node region 750 (and 744 in FIGS. 7A and 7C) through the vertical stack and extending predominantly in the first horizontal direction (D1) 709. The one or more etchant processes forms a vertical opening 751 to expose third sidewalls in the repeating iterations of alternating layers of a first dielectric material, 730-1, 730-2, . . . , 730-N, a semiconductor material, 732-1, 732-2, . . . , 732-N, and a second dielectric material, 733-1, 733-2, . . . , 733-N, in the vertical stack, shown in FIGS. 7B-7E, adjacent a second region of the semiconductor material. Other numerated components may be analogous to those shown and discussed in connection with FIG. 6A-6E.

In some embodiments, this process is performed before selectively removing an access device region, e.g., transistor region, of the semiconductor material in which to form a first source/drain region, channel region, and second source/drain region of the horizontally oriented access devices. In other embodiments, this process is performed after selectively removing an access device region of the semiconductor material in which to form a first source/drain region, channel region, and second source/drain region of the horizontally oriented access devices.

According to an example embodiment, shown in FIGS. 7B-7E, the method comprises forming a second vertical opening 751 in the vertical stack (401 in FIG. 4A) and selectively etching the second region 744 of the semiconductor material, 732-1, 732-2, . . . , 732-N, to form a second horizontal opening 734 a second horizontal distance (D2 opening) back from the vertical opening 751 in the vertical stack (401 in FIG. 4A). According to embodiments, selectively etching the second region 744 of the semiconductor material, 732-1, 732-2, . . . , 732-N can comprise using an atomic layer etching (ALE) process. As will be explained more in connection with FIG. 7C, a second source/drain region 778 can be formed in the semiconductor material, 732-1, 732-2, . . . , 732-N at a distal end of the second horizontal openings 734 from the vertical opening.

FIG. 7B illustrates a cross sectional view, taken along cut-line A-A' in FIG. 7A, showing another view of the semiconductor structure at this particular point in one example semiconductor fabrication process of an embodiment of the present disclosure. The cross sectional view shown in FIG. 7B is away from the plurality of separate, vertical access lines, 740-1, 740-2, . . . , 740-N, 740-(N+1), . . . , 740-(Z-1), and shows repeating iterations of alternating layers of a dielectric material, 730-1, 730-2, . . . , 730-(N+1), a semiconductor material, 732-1, 732-2, . . . , 732-N, and a second dielectric material, 733-1, 733-2, . . . , 733-N separated by an opening 751, on a semiconductor substrate 700 to form the vertical stack. As shown in FIG. 7B, a vertical direction 711 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 709. In the example embodiment of FIG. 7B, the materials within the vertical stack—a dielectric material, 730-1, 730-2, . . . , 730-(N+1), a semiconductor material, 732-1, 732-2, . . . , 732-N, and a second dielectric material, 733-1, 733-2, . . . , 733-N extending into and out of the plane of the drawing sheet in second direction (D2) and along an axis of orientation of the horizontal access devices and horizontal storage nodes of the arrays of vertically stacked memory cells of the three dimensional (3D) memory.

FIG. 7C illustrates a cross sectional view, taken along cut-line B-B' in FIG. 7A, showing another view of the semiconductor structure at this particular point in one example semiconductor fabrication process of an embodiment of the present disclosure. The cross sectional view shown in FIG. 7C is illustrated extending in the second direction (D2) 705, left and right along the plane of the drawing sheet, along an axis of the repeating iterations of alternating layers of a first dielectric material, 730-1, 730-2, . . . , 730-N, a semiconductor material, 732-1, 732-2, . . . , 732-N, and a second dielectric material, 733-1, 733-2, . . . , 733-N, and in which the horizontally oriented access devices and horizontally oriented storage nodes, e.g., capacitor cells, can be formed within the layers of semiconductor material, 732-1, 732-2, . . . , 732-N. In the example embodiment of FIG. 7C, an opening 756 is illustrated where the horizontally oriented storage nodes, e.g., capacitor cells, may be formed later in this semiconductor fabrication process.

In the example embodiment of FIG. 7C, a vertical opening 751 and horizontal openings 734 are shown formed from the mask, patterning and etching process described in connection with FIG. 7A. As shown in FIG. 7C, the semiconductor material, 732-1, 732-2, . . . , 732-N, in the second region 744 has been selectively removed to form the horizontal openings 734. In one example, an atomic layer etching (ALE) process is used to selectively etch the semiconductor material, 732-1, 732-2, . . . , 732-N, and remove a second distance (D2 opening) back from the vertical opening 751. Horizontally oriented storage nodes, e.g., capacitor cells, may be formed, as shown in FIGS. 8A-8E, later or first, relative to the fabrication process shown in FIGS. 4A-4K, in the second horizontal openings 734.

According to one example embodiment, as shown in FIG. 7C a second source/drain region 778 may be formed by flowing a high energy gas phase dopant, such as Phosphorous (P) for an n-type transistor, into the second horizontal openings 734 to implant the dopant in the semiconductor material, 732-1, 732-2, . . . , 732-N, at a distal end of the second horizontal openings 734 from the vertical opening 751. In one example, gas phase doping may be used to achieve a highly isotropic e.g., non-directional doping, to form the second source/drain region 778 to a horizontally oriented access device in region 742. In another example, thermal annealing with doping gas, such as phosphorous may be used with a high energy plasma assist to break the bonding. Embodiments, however, are not so limited and other suitable semiconductor fabrication techniques may be utilized.

As shown further in FIG. 8C, a first electrode, e.g., 861, for horizontally oriented storage nodes are to be coupled to the second source/drain regions 778 of the horizontal access devices. As shown later in FIG. 8C, such horizontally oriented storage nodes are shown formed in a second horizontal opening 734 extending in second direction (D2), left and right in the plane of the drawing sheet, a second distance (D2 opening) from the vertical opening 751 formed in the vertical stack, e.g., 401 in FIG. 4A, and along an axis of orientation of the horizontal access devices and horizontal storage nodes of the arrays of vertically stacked memory cells of the three dimensional (3D) memory. In FIG. 7C, a neighboring, opposing vertical access line 740-3 is illustrated by a dashed line indicating a location set inward from the plane and orientation of the drawing sheet.

FIG. 7D illustrates a cross sectional view, taken along cut-line C-C' in FIG. 7A, showing another view of the semiconductor structure at this particular point in one example semiconductor fabrication process of an embodiment of the present disclosure. The cross sectional view shown in FIG. 7D is illustrated extending in the second direction (D2) 705, left and right in the plane of the drawing sheet, along an axis of the repeating iterations of alternating layers of a first dielectric material, 730-1, 730-2, ..., 730-N, a semiconductor material, 732-1, 732-2, ..., 732-N, and a second dielectric material, 733-1, 733-2, ..., 733-N, outside of a region in which the horizontally oriented access devices and horizontally oriented storage nodes, e.g., capacitor cells, will be formed within the layers of semiconductor material, 732-1, 732-2, ..., 732-N. At the left end of the drawing sheet is shown the repeating iterations of alternating layers of a first dielectric material, 730-1, 730-2, ..., 730-N, a semiconductor material, 732-1, 732-2, ..., 732-N, and a second dielectric material, 733-1, 733-2, ..., 733-N, at which location a horizontally oriented digit line, e.g., digit lines 107-1, 107-2, ..., 107-P shown in FIG. 1, et. seq., can be integrated to form electrical contact with first source/drain regions or digit line conductive contact material, described above in connection with FIGS. 4A-4K.

Again, while first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

FIG. 7E illustrates a cross sectional view, taken along cut-line D-D' in FIG. 7A, showing another view of the semiconductor structure at this particular point in one example semiconductor fabrication process of an embodiment of the present disclosure. The cross sectional view shown in FIG. 7E is illustrated, right to left in the plane of the drawing sheet, extending in the first direction (D1) 709 along an axis of the repeating iterations of alternating layers of a first dielectric material, 730-1, 730-2, ..., 730-N, a semiconductor material, 732-1, 732-2, ..., 732-N, and a second dielectric material, 733-1, 733-2, ..., 733-N, intersecting across the plurality of separate, vertical access lines, 740-1, 740-2, ..., 740-4, and intersecting regions of the semiconductor material, 732-1, 732-2, ..., 732-N, in which a channel and body region may be formed, separated from the plurality of separate, vertical access lines, 740-1, 740-2, ..., 740-4, by the gate dielectric 738. In FIG. 7E, the first dielectric fill material 739 is shown separating the space between neighboring horizontally oriented access devices which may be formed extending into and out from the plane of the drawing sheet as described in connection with FIGS. 4A-4K, and can be spaced along a first direction (D1) 709 and stacked vertically in arrays extending in the third direction (D3) 711 in the three dimensional (3D) memory.

Figure 8A:
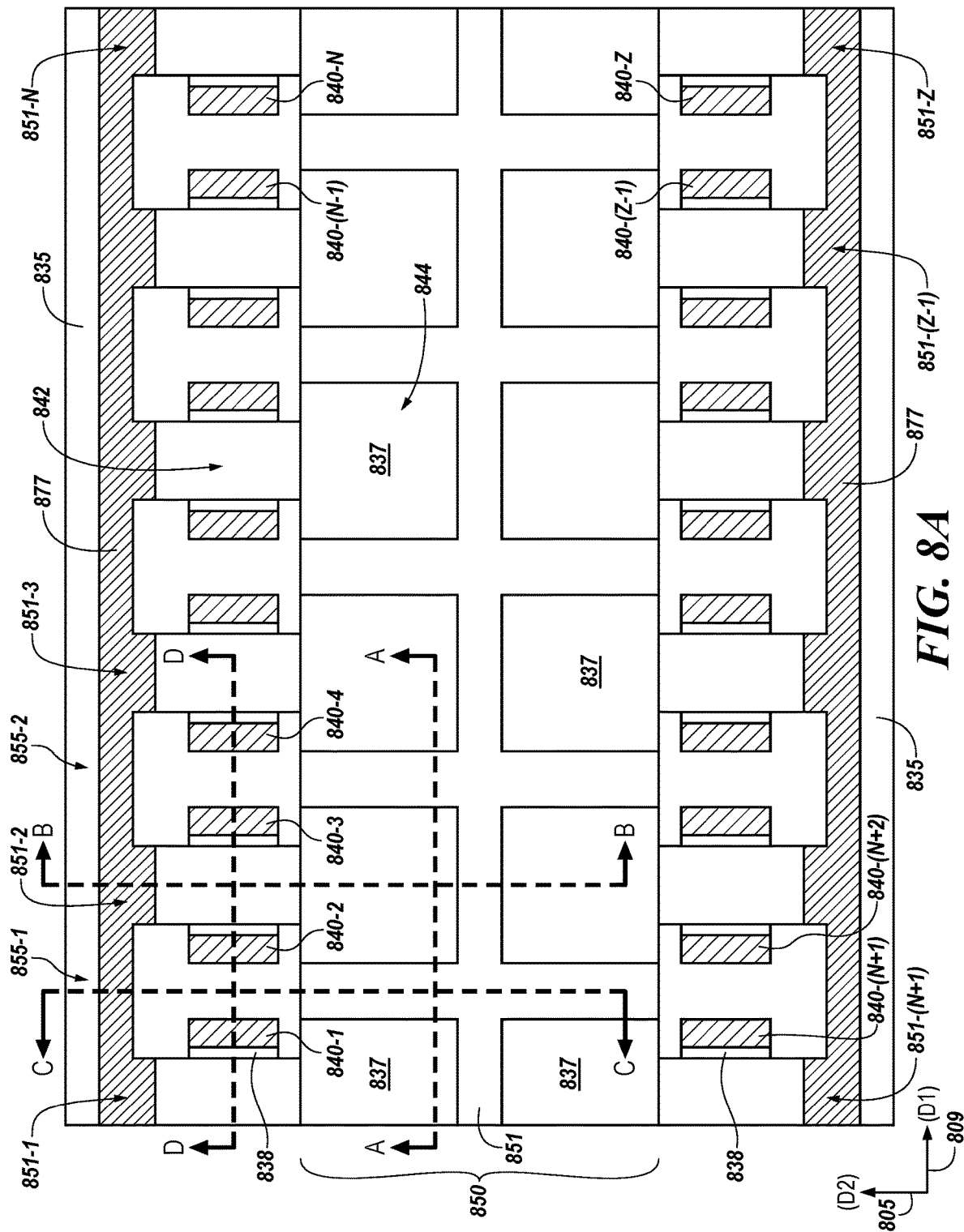

FIG. 8A illustrates an example method, at another stage of a semiconductor fabrication process, for forming arrays of vertically stacked memory cells having a channel and body region for semiconductor devices, in accordance with a number of embodiments of the present disclosure. FIG. 8A illustrates a top down view of a semiconductor structure, at a particular point in time, in a semiconductor fabrication process, according to one or more embodiments. In the example embodiment of FIG. 8A, the method comprises using a photolithographic process to pattern the photolithographic masks 835, 836 and/or 837, e.g., 635, 636, and/or 637 in FIGS. 6A-6E or 735, 736, and/or 737 in FIGS. 7A-7E. The method in FIG. 8A, further illustrates using one or more etchant processes to form a vertical opening 851 in a storage node region 850 (and 844 in FIGS. 8A and 8C) through the vertical stack and extending predominantly in the first horizontal direction (D1) 809. The one or more etchant processes forms a vertical opening 851 to expose third sidewalls in the repeating iterations of alternating layers of a first dielectric material, 830-1, 830-2, ..., 830-N, a semiconductor material, 832-1, 832-2, ..., 832-N, and a second dielectric material, 833-1, 833-2, ..., 833-N, in the vertical stack, shown in FIGS. 8B-8E, adjacent a second region of the semiconductor material. Other numerated components may be analogous to those shown and discussed in connection with FIGS. 6 and 7.

In some embodiments, this process is performed after selectively removing an access device region of the semiconductor material in which to form a first source/drain region, channel region, and second source/drain region of the horizontally oriented access devices, as illustrated in FIG. 7. According to an example embodiment, shown in FIGS. 8B-8E, the method comprises selectively etching the second region of the semiconductor material, 832-1, 832-2, ..., 832-N, to deposit a second source/drain region and capacitor cells through the second horizontal opening, which is a second horizontal distance back from a vertical opening 851 in the vertical stack. In some embodiments, as shown in FIGS. 8B-8E, the method comprises forming capacitor cell as the storage node in the second horizontal opening. By way of example, and not by way of limitation, forming the capacitor comprises using an atomic layer deposition (ALD) process to sequentially deposit, in the second horizontal opening, a first electrode 861 and a second electrode 856 separated by a cell dielectric 863. Other suitable semiconductor fabrication techniques and/or storage nodes structures may be used.

FIG. 8B illustrates a cross sectional view, taken along cut-line A-A' in FIG. 8A, showing another view of the semiconductor structure at this particular point in one example semiconductor fabrication process of an embodiment of the present disclosure. The cross sectional view shown in FIG. 8B is away from the plurality of separate, vertical access lines, 840-1, 840-2, ..., 840-N, 840-(N+1), ..., 840-(Z−1), and shows repeating iterations of alternating layers of a dielectric material, 830-1, 830-2, ..., 830-(N+1) and a second dielectric material 833-1, 833-2, ..., 833-N, separated by horizontally oriented capacitor cells having first electrodes 861, e.g., bottom cell contact electrodes, cell dielectrics 863, and second electrodes 856, e.g., top, common node electrodes, on a semiconductor substrate 800 to form the vertical stack. As shown in FIG. 8B, a vertical direction 811 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 809. In the example embodiment of FIG. 8B, the first electrodes 861, e.g., bottom electrodes to be coupled to source/drain regions of horizontal access devices, and second electrodes 856 are illustrated separated by a cell dielectric material 863 extending into and out of the plane of the drawing sheet in second direction (D2) and along an axis of orientation of the horizontal access devices and horizontal storage nodes of the arrays of vertically stacked memory cells of the three dimensional (3D) memory.

FIG. 8C illustrates a cross sectional view, taken along cut-line B-B' in FIG. 8A, showing another view of the semiconductor structure at this particular point in one example semiconductor fabrication process of an embodiment of the present disclosure. The cross sectional view shown in FIG. 8C is illustrated extending in the second direction (D2) 805, left and right along the plane of the drawing sheet, along an axis of the repeating iterations of alternating layers of a first dielectric material, 830-1, 830-2, . . . , 830-N, a semiconductor material, 832-1, 832-2, . . . , 832-N, and a second dielectric material, 833-1, 833-2, . . . , 833-N, along and in which the horizontally oriented access devices and horizontally oriented storage nodes, e.g., capacitor cells, can be formed within the layers of semiconductor material, 832-1, 832-2, . . . , 832-N. In the example embodiment of FIG. 8C, the horizontally oriented storage nodes, e.g., capacitor cells, are illustrated as having been formed in this semiconductor fabrication process and first electrodes 861, e.g., bottom electrodes to be coupled to source/drain regions of horizontal access devices, and second electrodes 856, e.g., top electrodes to be coupled to a common electrode plane such as a ground plane, separated by cell dielectrics 863, are shown. However, embodiments are not limited to this example. In other embodiments the first electrodes 861, e.g., bottom electrodes to be coupled to source/drain regions of horizontal access devices, and second electrodes 856, e.g., top electrodes to be coupled to a common electrode plane such as a ground plane, separated by cell dielectrics 863, may be formed subsequent to forming a first source/drain region, a channel and body region, and a second source/drain region in a region of the semiconductor material, 832-1, 832-2, . . . , 832-N, intended for location, e.g., placement formation, of the horizontally oriented access devices, described next.

In the example embodiment of FIG. 8C, the horizontally oriented storage nodes having the first electrodes 861, e.g., bottom electrodes to be coupled to source/drain regions of horizontal access devices, and second electrodes 856, e.g., top electrodes to be coupled to a common electrode plane such as a ground plane, are shown formed in a second horizontal opening, e.g., 734 shown in FIG. 7C, extending in second direction (D2), left and right in the plane of the drawing sheet, a second distance (D2 opening) from the vertical opening, e.g., 751 in FIG. 7C, formed in the vertical stack, e.g., 401 in FIG. 4A, and along an axis of orientation of the horizontal access devices and horizontal storage nodes of the arrays of vertically stacked memory cells of the three dimensional (3D) memory. In FIG. 8C, a neighboring, opposing vertical access line 840-3 is illustrated by a dashed line indicating a location set inward from the plane and orientation of the drawing sheet.

Figure 8D:
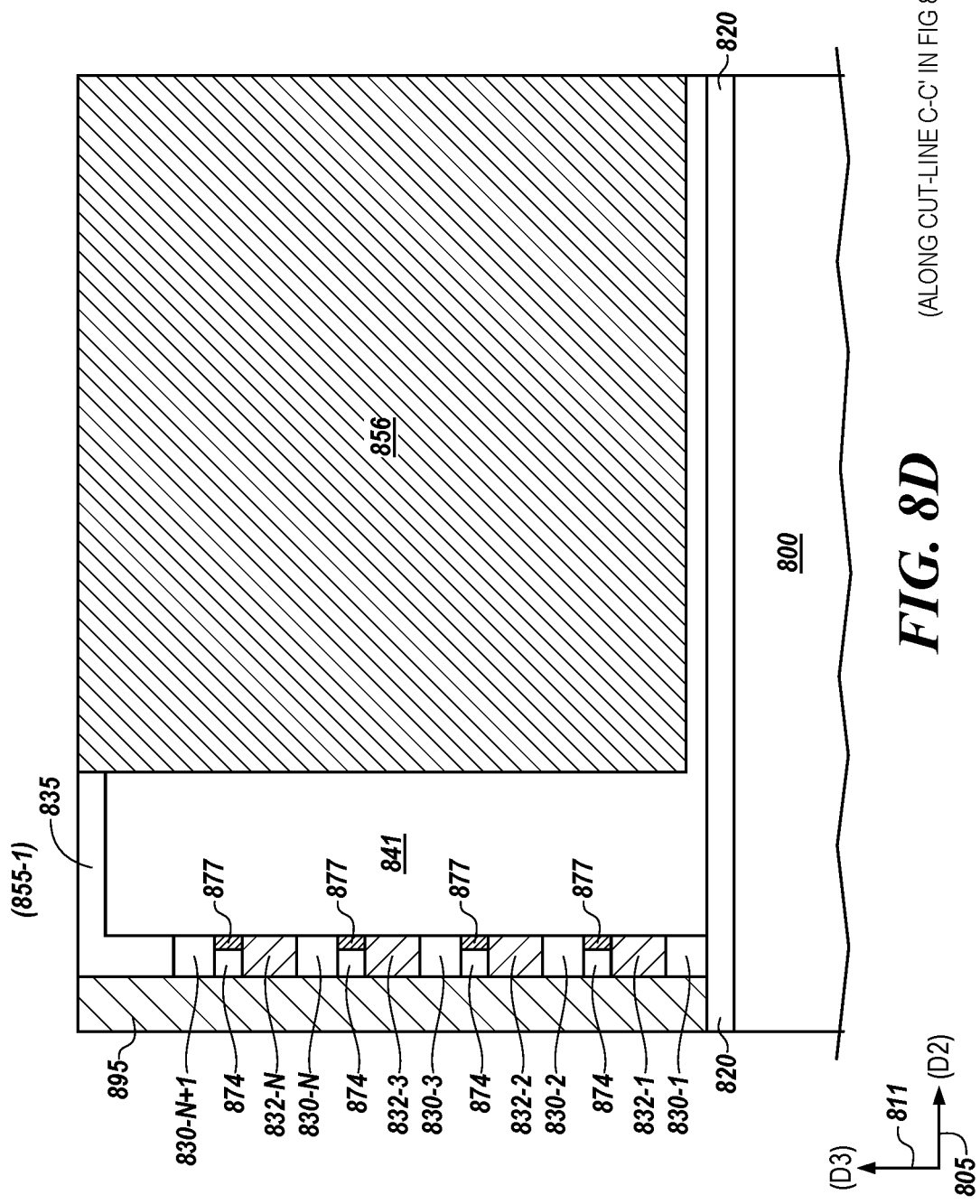

FIG. 8D illustrates a cross sectional view, taken along cut-line C-C' in FIG. 8A, showing another view of the semiconductor structure at this particular point in one example semiconductor fabrication process of an embodiment of the present disclosure. The cross sectional view shown in FIG. 8D is illustrated extending in the second direction (D2) 805, left and right in the plane of the drawing sheet, along an axis of the repeating iterations of alternating layers of a first dielectric material, 830-1, 830-2, . . . , 830-N, a semiconductor material, 832-1, 832-2, . . . , 832-N, and a second dielectric material, 833-1, 833-2, . . . , 833-N, outside of a region in which the horizontally oriented access devices and horizontally oriented storage nodes, e.g., capacitor cells, will be formed within the layers of semiconductor material, 832-1, 832-2, . . . , 832-N. In FIG. 8C, the dielectric material 841 is shown filling the space between the horizontally oriented access devices, which can be spaced along a first direction (D1), extending into and out from the plane of the drawings sheet, for a three dimensional array of vertically oriented memory cells. However, in the cross sectional view of FIG. 8D, the second electrode 856, e.g., top, common electrode to the capacitor cell structure, is additionally shown present in the space between horizontally neighboring devices. At the left end of the drawing sheet is shown the repeating iterations of alternating layers of a first dielectric material, 830-1, 830-2, . . . , 830-N, a semiconductor material, 832-1, 832-2, . . . , 832-N, and a second dielectric material, 833-1, 833-2, . . . , 833-N, at which location a horizontally oriented digit line, e.g., digit lines 107-1, 107-2, . . . , 107-P shown in FIG. 1, et. seq., can be integrated to form electrical contact with the second source/drain regions or digit line conductive contact material, described in more detail below.

FIG. 8E illustrates a cross sectional view, taken along cut-line D-D' in FIG. 8A, showing another view of the semiconductor structure at this particular point in one example semiconductor fabrication process of an embodiment of the present disclosure. The cross sectional view shown in FIG. 8E is illustrated, right to left in the plane of the drawing sheet, extending in the first direction (D1) 809 along an axis of the repeating iterations of alternating layers of a first dielectric material, 830-1, 830-2, . . . , 830-N, a semiconductor material, 832-1, 832-2, . . . , 832-N, and a second dielectric material, 833-1, 833-2, . . . , 833-N, intersecting across the plurality of separate, vertical access lines, 840-1, 840-2, . . . , 840-4, and intersecting regions of the semiconductor material, 832-1, 832-2, . . . , 832-N, in which a channel and body region may be formed, separated from the plurality of separate, vertical access lines, 840-1, 840-2, . . . , 840-4, by the gate dielectric 838. In FIG. 8E, the first dielectric fill material 839 is shown separating the space between neighboring horizontally oriented access devices and horizontally oriented storage nodes, which may be formed extending into and out from the plane of the drawing sheet as described in more detail below, and can be spaced along a first direction (D1) 809 and stacked vertically in arrays extending in the third direction (D3) 811 in the three dimensional (3D) memory. FIG. 8 illustrates a cross-sectional view of a portion of an example horizontally oriented access device coupled to a horizontally oriented storage node and coupled to vertically oriented access lines and horizontally oriented digit lines, as may form part of an array of vertically stacked memory cells, in accordance with a number of embodiments of the present disclosure. The horizontally oriented access device 801 can have a first source/drain region and a second source drain region separated by a channel and body region, and gates opposing the channel region and separated therefrom by a gate dielectric.

Figure 9:
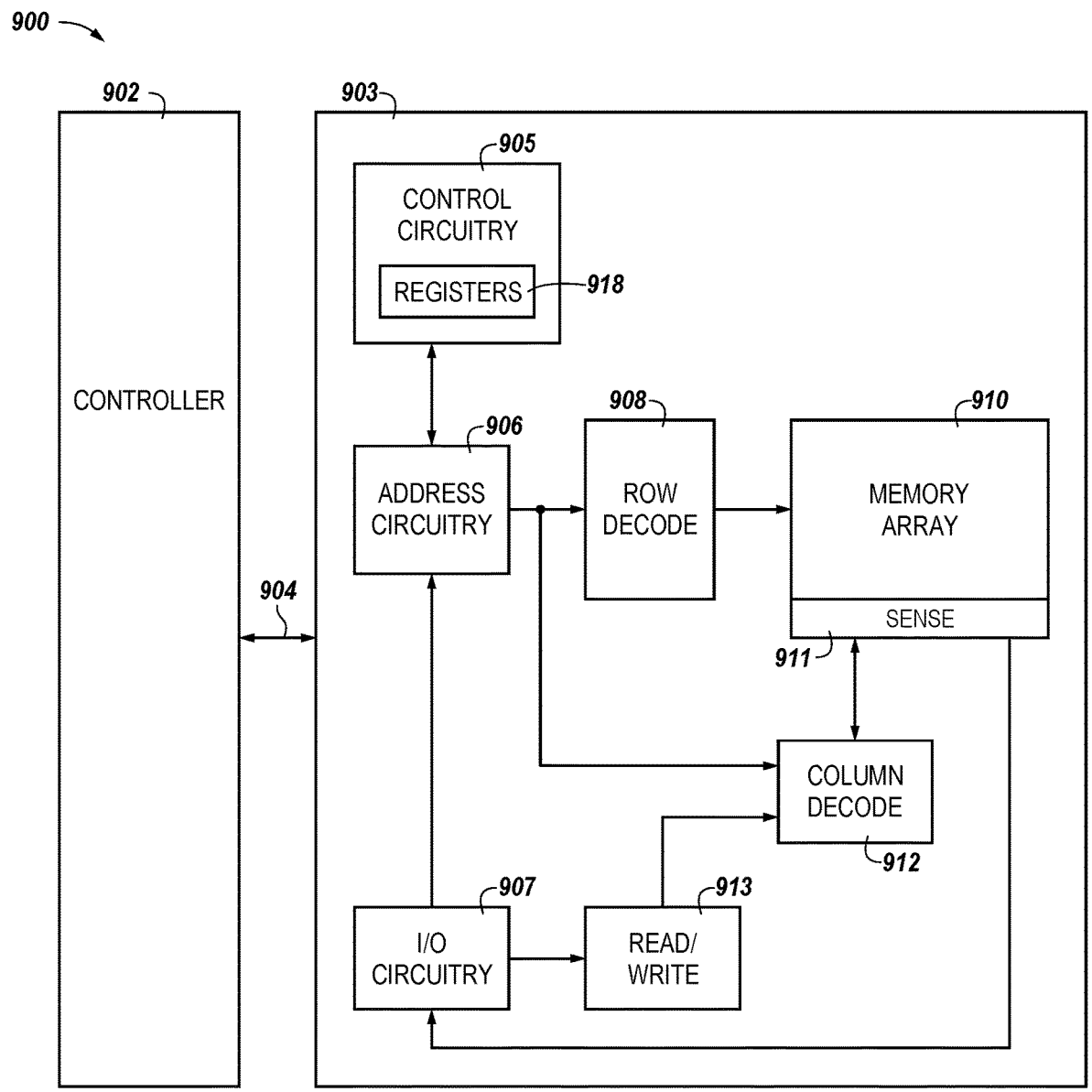
FIG. 9 is a block diagram of an apparatus in the form of a computing system including a memory device in accordance with a number of embodiments of the present disclosure.

FIG. 9 is a block diagram of an apparatus in the form of a computing system 900 including a memory device 903 in accordance with a number of embodiments of the present disclosure. As used herein, a memory device 903, a memory array 910, and/or a host 902, for example, might also be separately considered an "apparatus." According to embodiments, the memory device 903 may comprise at least one memory array 910 with a memory cell formed having a digit line and body contact, according to the embodiments described herein.

In this example, system 900 includes a host 902 coupled to memory device 903 via an interface 904. The computing system 900 can be a personal laptop computer, a desktop computer, a digital camera, a mobile telephone, a memory card reader, or an Internet-of-Things (IoT) enabled device, among various other types of systems. Host 902 can include a number of processing resources (e.g., one or more processors, microprocessors, or some other type of controlling circuitry) capable of accessing memory 903. The system 900 can include separate integrated circuits, or both the host 902 and the memory device 903 can be on the same integrated circuit. For example, the host 902 may be a system controller of a memory system comprising multiple memory devices 903, with the system controller 905 providing access to the respective memory devices 903 by another processing resource such as a central processing unit (CPU).

In the example shown in FIG. 1, the host 902 is responsible for executing an operating system (OS) and/or various applications (e.g., processes) that can be loaded thereto (e.g., from memory device 903 via controller 905). The OS and/or various applications can be loaded from the memory device 903 by providing access commands from the host 902 to the memory device 903 to access the data comprising the OS and/or the various applications. The host 902 can also access data utilized by the OS and/or various applications by providing access commands to the memory device 903 to retrieve said data utilized in the execution of the OS and/or the various applications.

For clarity, the system 900 has been simplified to focus on features with particular relevance to the present disclosure. The memory array 910 can be a DRAM array comprising at least one memory cell having a digit line and body contact formed according to the techniques described herein. For example, the memory array 910 can be an unshielded DL 4F2 array such as a 3D-DRAM memory array. The array 910 can comprise memory cells arranged in rows coupled by word lines (which may be referred to herein as access lines or select lines) and columns coupled by digit lines (which may be referred to herein as sense lines or data lines). Although a single array 910 is shown in FIG. 1, embodiments are not so limited. For instance, memory device 903 may include a number of arrays 910 (e.g., a number of banks of DRAM cells).

The memory device 903 includes address circuitry 906 to latch address signals provided over an interface 904. The interface can include, for example, a physical interface employing a suitable protocol (e.g., a data bus, an address bus, and a command bus, or a combined data/address/command bus). Such protocol may be custom or proprietary, or the interface 904 may employ a standardized protocol, such as Peripheral Component Interconnect Express (PCIe), Gen-Z, CCIX, or the like. Address signals are received and decoded by a row decoder 908 and a column decoder 912 to access the memory array 910. Data can be read from memory array 910 by sensing voltage and/or current changes on the sense lines using sensing circuitry 911. The sensing circuitry 911 can comprise, for example, sense amplifiers that can read and latch a page (e.g., row) of data from the memory array 910. The I/O circuitry 907 can be used for bi-directional data communication with the host 902 over the interface 904. The read/write circuitry 913 is used to write data to the memory array 910 or read data from the memory array 910. As an example, the circuitry 913 can comprise various drivers, latch circuitry, etc.

Control circuitry 905 includes registers 918 and decodes signals provided by the host 902. The signals can be commands provided by the host 902. These signals can include chip enable signals, write enable signals, and address latch signals that are used to control operations performed on the memory array 910, including data read operations, data write operations, and data erase operations. In various embodiments, the control circuitry 905 is responsible for executing instructions from the host 902. The control circuitry 905 can comprise a state machine, a sequencer, and/or some other type of control circuitry, which may be implemented in the form of hardware, firmware, or software, or any combination of the three. In some examples, the host 902 can be a controller external to the memory device 103. For example, the host 902 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method, comprising:
    forming layers of a first dielectric material, a semiconductor material, and a second dielectric material, in repeating iterations vertically to form a vertical stack;
    forming a vertical opening using an etchant process to expose vertical sidewalls in the vertical stack;
    depositing a seed material on the vertical sidewall in the vertical stack; and
    processing the vertical stack under temperature and time parameters such that the seed material on the sidewall of the semiconductor material advances into the semiconductor material by a first distance to transform a portion of the semiconductor material of the first distance into a crystalline structure.

2. The method of claim 1, wherein forming layers of the first dielectric material, the semiconductor material, and the second dielectric material, in repeating iterations vertically to form the vertical stack, comprises:
    depositing an oxide material as the first dielectric material;
    depositing an amorphous silicon material as the semiconductor material; and
    depositing a nitride material as the second dielectric material.

3. The method of claim 2, wherein the seed material comprises Nickel as the seed material and processing the vertical stack under the temperature and time parameters comprises forming a Nickel (Ni) silicide with the Nickel and the amorphous silicon at the first distance away from the vertical opening.

4. The method of claim 2, wherein the seed material comprises Cobalt as the seed material and processing the vertical stack under the temperature and time parameters comprises forming a Cobalt (Co) silicide with the Cobalt and the amorphous silicon at the first distance away from the vertical opening.

5. The method of claim 2, wherein the seed material comprises Silver as the seed material and processing the vertical stack under the temperature and time parameters comprises forming a Silver (Ag) silicide with the Silver and the amorphous silicon at the first distance away from the vertical opening.

6. The method of claim 1, further comprising forming the vertical opening to have a width in a range of 50-500 nanometers (nm) and a depth in a range of 500-20,000 nm.

7. The method of claim 1, further comprising depositing the seed material to a thickness in a range of approximately 5-50 angstroms (Å).

8. The method of claim 1, further comprising advancing the seed material within the semiconductor material to a horizontal distance (D1) of approximately 200 nanometers (nm) from the vertical opening.

9. The method of claim 1, further comprising processing the vertical stack under temperature and time parameters such that, as the seed material advances horizontally within the semiconductor material, it transforms the crystalline structure of the portion of the semiconductor material according to a metal induced lateral crystallization (MILC) process.

10. The method of claim 1, further comprising processing the vertical stack under temperature and time parameters such that as the seed material advances horizontally within the semiconductor material it transforms the crystalline structure of the portion of the semiconductor material according to a solid phase crystallization (SPC).

11. The method of claim 1, further comprising processing the vertical stack under temperature and time parameters such that, as the seed material advances within the semiconductor material, it transforms the crystalline structure of the portion of the semiconductor material into a monocrystalline silicon material.

12. The method of claim 1, further comprising processing the vertical stack under temperature and time parameters such that, as the seed material advances within the semiconductor material, it transforms the crystalline structure of the portion of the semiconductor material to increase a size of individual crystals in the portion of the semiconductor material.

13. A method, comprising:
    depositing layers of an oxide material, a silicon material, and a nitride material, in repeating iterations vertically to form a vertical stack;
    forming a vertical opening using an etchant process to expose vertical sidewalls in the vertical stack;
    selectively depositing a metal seed material to form a metal silicide on vertical sidewalls of the silicon material in the vertical opening of the vertical stack; and
    processing the vertical stack under temperature and time parameters such that the metal silicide advances horizontally through the silicon material, bounded by the oxide material and the nitride material, and transforms a portion of the silicon material from an amorphous silicon structure to a monocrystalline silicon structure along a length of a first distance from the vertical opening.

14. The method of claim 13, further comprising processing the vertical stack such that the metal silicide advances horizontally through the silicon material the first distance and provides a dividing interface between the monocrystalline silicon and the amorphous silicon structure, wherein crystal on the monocrystalline side of the interface are larger than the crystals in the amorphous silicon structure.

15. The method of claim 13, further comprising processing the vertical stack at a temperature in a range of 400 to 600 degrees Celsius (° C.) such that the metal silicide advances horizontally through the silicon material.

16. The method of claim 13, further comprising processing the vertical stack under temperature and time parameters such that the metal silicide advances horizontally through the silicon material a first distance of at least 200 nanometers (nm).

17. The method of claim 13, further comprising selectively depositing Nickel (Ni) as the metal seed to form a Nickel silicide with the silicon material.

18. The method of claim 13, further comprising selectively depositing the Nickel on the silicon material using an atomic layer deposition (ALD) process.

19. A method, comprising:
depositing layers of an oxide material, an amorphous silicon material, and a nitride material, in repeating iterations vertically to from a vertical stack;
forming a vertical opening using an etchant process to expose vertical sidewalls in the vertical stack;
selectively depositing a metal seed material on the vertical sidewalls of the amorphous silicon to form a metal silicide using an atomic layer deposition (ALD) process; and
processing the vertical stack under temperature and time parameters to horizontally advance the metal silicide through the amorphous silicon, recrystallizing the amorphous silicon into a monocrystalline silicon structure a first distance (D1) from the vertical opening to define a first region in the vertical stack.

20. The method of claim 19, further comprising:
using the recrystallized monocrystalline silicon structure in the first region for formation of a horizontally oriented access device in the vertical stack; and
using the metal silicide the first distance from the vertical opening as a etch stop while selectively removing the amorphous silicon from a second region of the vertical stack for formation of a storage node.

21. The method of claim 19, further comprising:
using an atomic layer deposition (ALD) process to form a horizontal capacitor cell in the selectively removed amorphous silicon in the second region; and
using the metal silicide material as an ohmic contact to a first electrode of the capacitor formed in the second region.

22. The method of claim 19, further comprising processing the vertical stack under temperature and time parameters to horizontally advance the metal silicide, recrystallizing the amorphous silicon into a monocrystalline silicon structure to have sub-grain boundaries.

23. A memory cell array, comprising:
a plurality of access transistors stacked on one another, each of the access transistors including a first source/drain region, a second source/drain region and a channel region therebetween which are horizontally arranged, and a body region, wherein the channel region and the body region are each formed of a single crystalline semiconductor material;
a metal silicide within each access transistor of the plurality of access transistors, wherein the single crystalline semiconductor material of each access transistor is on an opposite side of the metal silicide than an amorphous semiconductor material of each access transistor;
at least one access line elongating vertically and coupled to each of the channel regions of the plurality of access transistors with an intervention of a gate dielectric;
a plurality of storage capacitors stacked on one another, each of the plurality of storage capacitors lying horizontally and coupled to a corresponding one of the second source/drain regions of the plurality of access transistors;
a plurality of digit lines, each of the plurality of digit lines coupled to a corresponding one of the first source/drain regions of the plurality of access transistors; and
a body contact elongating vertically and coupled to each of the body regions of the plurality of access transistors.

24. The memory cell array of claim 23, wherein the access transistors have three nodes comprising the first source/drain region (1), the second source/drain region (2), and the channel region (3), having a direct, electrical body contact.

25. The memory cell array of claim 23, wherein the storage capacitors comprise capacitor cells having a first horizontally oriented electrode electrically coupled to the first source/drain regions of the access transistors and a second electrode separated from the first horizontally oriented electrode by a cell dielectric.

* * * * *